US012575305B2

(12) United States Patent
Jeon et al.

(10) Patent No.: US 12,575,305 B2
(45) Date of Patent: Mar. 10, 2026

(54) DISPLAY DEVICE INCLUDING COLOR FILTERS ON A LIGHT BLOCKING LAYER

(71) Applicant: Samsung Display Co., LTD., Yongin-si (KR)

(72) Inventors: Ha Seok Jeon, Yongin-si (KR); Choong Youl Im, Yongin-si (KR); Hyun Duck Cho, Yongin-si (KR); Beohm Rock Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 358 days.

(21) Appl. No.: 18/106,945

(22) Filed: Feb. 7, 2023

(65) Prior Publication Data

US 2023/0413651 A1      Dec. 21, 2023

(30) Foreign Application Priority Data

Jun. 15, 2022      (KR) ........................ 10-2022-0072539

(51) Int. Cl.
| | |
|---|---|
| *H10K 59/80* | (2023.01) |
| *H10K 59/122* | (2023.01) |
| *H10K 59/38* | (2023.01) |

(52) U.S. Cl.
CPC ....... *H10K 59/8792* (2023.02); *H10K 59/122* (2023.02); *H10K 59/38* (2023.02)

(58) Field of Classification Search
CPC .. H10K 59/8792; H10K 50/865; H10K 59/38; H10K 59/122; H10K 59/40; H10K 59/353
See application file for complete search history.

(56) References Cited

U.S. PATENT DOCUMENTS

| | | | |
|---|---|---|---|
| 10,854,687 | B2 | 12/2020 | Joo et al. |
| 11,495,643 | B2 | 11/2022 | Joo et al. |

(Continued)

FOREIGN PATENT DOCUMENTS

| | | |
|---|---|---|
| KR | 2009-0106851 A | 10/2009 |
| KR | 10-2019-0004874 A | 1/2019 |

(Continued)

OTHER PUBLICATIONS

Office action issued Mar. 25, 2025 by the European Patent Office for corresponding Patent Application No. EP 23170590.6, 6 pages.

(Continued)

*Primary Examiner* — Nduka E Ojeh
(74) *Attorney, Agent, or Firm* — Womble Bond Dickinson (US) LLP

(57) ABSTRACT

A display device includes a plurality of emission areas, a light blocking layer comprising a plurality of holes overlapping the emission areas and between adjacent emission areas, and a color filters in the plurality of holes and overlapping the emission areas, wherein emission areas include a first emission area, a second emission area spaced apart from the first emission area in a plan view normal to the third direction and a third emission area spaced apart from the second emission area in the plan view normal to the third direction, and the plurality of color filters includes first, second and third color filters overlapping the first, second, and third emission areas, respectively, wherein a portion of the second color filter is on the first color filter adjacent to the second color filter and on the third color filter adjacent to the second color filter.

27 Claims, 27 Drawing Sheets

(56)             References Cited

U.S. PATENT DOCUMENTS

| | | |
|---|---|---|
| 11,730,038 B2 | 8/2023 | Joo et al. |
| 11,778,884 B2 | 10/2023 | Lee et al. |
| 11,956,997 B2 | 4/2024 | Son et al. |
| 12,029,094 B2 | 7/2024 | Choi et al. |
| 12,302,701 B2 | 5/2025 | Son et al. |
| 12,439,793 B2 | 10/2025 | Joo et al. |
| 2018/0182814 A1* | 6/2018 | Kim ................... H10K 59/8792 |
| 2018/0197921 A1* | 7/2018 | Kim ...................... H10K 59/38 |
| 2019/0013363 A1 | 1/2019 | Joo et al. |
| 2019/0245017 A1 | 8/2019 | Jeon et al. |
| 2020/0212113 A1* | 7/2020 | Song ................... H10K 59/122 |
| 2021/0175468 A1* | 6/2021 | Lee ........................ H10K 59/40 |
| 2021/0273021 A1 | 9/2021 | Lee et al. |
| 2022/0069014 A1 | 3/2022 | Choi et al. |
| 2022/0130915 A1 | 4/2022 | Son et al. |

FOREIGN PATENT DOCUMENTS

| | | |
|---|---|---|
| KR | 10-2021-0109716 A | 9/2021 |
| KR | 2021-0142051 A | 11/2021 |
| KR | 10-2022-0030367 A | 3/2022 |
| KR | 10-2022-0053756 A | 5/2022 |

OTHER PUBLICATIONS

Office action issued Jan. 12, 2026 by the Ministry of Intellectual Property (Republic of Korea) for corresponding Korean Patent Application No. 10-2022-0072539, 12 pages.

* cited by examiner

TSU: SIL1, SIL2, SIL3, TL

TSU: SIL1, SIL2, SIL3, TL

TSU: SIL1, SIL2, SIL3, TL

TSU: SIL1, SIL2, SIL3, TL

TSU: SIL1, SIL2, SIL3, TL

TSU: SIL1, SIL2, SIL3, TL

DISPLAY DEVICE INCLUDING COLOR FILTERS ON A LIGHT BLOCKING LAYER

CROSS-REFERENCE TO RELATED APPLICATION

This application claims priority to and the benefit of from Korean Patent Application No. 10-2022-0072539 filed on Jun. 15, 2022 in the Korean Intellectual Property Office, the entire content of which is hereby incorporated by reference.

BACKGROUND

1. Field

The disclosure relates to a display device.

2. Description of the Related Art

As the information society develops, demands for suitable forms of display devices for displaying images are increasing. For example, display devices are applied to one or more suitable electronic devices such as smartphones, digital cameras, notebook computers, navigation devices, and smart televisions. The display devices may be flat panel display devices such as liquid crystal display devices, field emission display devices, and/or organic light emitting display devices. Among these flat panel display devices, a light emitting display device includes a light emitting element that enables each pixel of a display panel to emit light by itself. Thus, the light emitting display device can display an image without a backlight unit that provides light to the display panel.

A recent display device supports an input utilizing a user's body part (e.g., a finger) and an input utilizing an input pen. Because the display device senses the input utilizing the input pen, it can sense an input more precisely than when sensing only the input utilizing the user's body part.

SUMMARY

Aspects of one or more embodiments of the present disclosure are directed towards a display device including color filters disposed on light emitting elements and capable of reducing reflected light due to external light by overlapping the color filters.

Additional aspects will be set forth in part in the description which follows and, in part, will be apparent from the description, or may be learned by practice of the presented embodiments of the disclosure.

According to one or more embodiments of the present disclosure, a display device includes a plurality of emission areas arranged in a first direction, a second direction intersecting the first direction, and a third direction intersecting the first direction and the second direction, and in which light emitting elements to emit light are located, a light blocking layer including a plurality of holes overlapping the plurality of emission areas and between adjacent emission areas of the plurality of emission areas, and a plurality of color filters in the plurality of holes of the light blocking layer and overlapping the plurality of emission areas, wherein the plurality of emission areas includes a first emission area, a second emission area spaced apart from the first emission area in a plan view normal to the third direction (e.g., in the first or second direction) and a third emission area spaced apart from the second emission area in a plan view normal to the third direction, and wherein the plurality of the color filters includes a first color filter overlapping the first emission area, a second color filter overlapping the second emission area and a third color filter overlapping the third emission area, wherein a portion of the second color filter is on the first color filter adjacent to the second color filter in the plan view normal to the third direction on the light blocking layer and on the third color filter adjacent to the second color filter in the plan view normal to the third direction on the light blocking layer.

In one or more embodiments, planar areas (e.g., areas in a plan view) of the first color filter, the second color filter and the third color filter may be larger than planar areas (e.g., areas in a plan view) of the plurality of holes of the light blocking layer, respectively.

In one or more embodiments, the planar areas of the plurality of holes of the light blocking layer may be larger than planar areas (e.g., areas in the plan view) of the plurality of emission areas.

In one or more embodiments, the plurality of color filters may cover the light blocking layer.

In one or more embodiments, a portion of each of the first color filter, the second color filter, and the third color filter may be on the light blocking layer.

In one or more embodiments, the first emission area and the third emission area may be spaced apart from each other in the first direction or the second direction, and a portion of the third color filter may be on an adjacent first color filter on the light blocking layer.

In one or more embodiments, an overlapping portion of the first color filter and the second color filter may be adjacent to the second emission area from a center of a portion of the light blocking layer between the first emission area and the second emission area.

In one or more embodiments, an overlapping portion of the second color filter and the third color filter may be adjacent to the third emission area from a center of a portion of the light blocking layer between the second emission area and the third emission area.

In one or more embodiments, the planar area of the first color filter may be equal to or larger than the planar area of the second color filter and a planar area of the third color filter.

In one or more embodiments, the planar area of the first color filter may be larger than the planar area of the third color filter, and the second color filter extends in the plan view normal to the third direction in the plan view.

In one or more embodiments, the planar areas of the first color filter and the planar area of the second color filter may have a ratio of 1:0.4 to 1:0.6, and the planar areas of the first color filter and the planar area of the third color filter may have a ratio of 1:0.4 to 1:1.

In one or more embodiments, the second color filter and the third color filter may have a circular shape in the plan view, and the first color filter may overlap the light blocking layer.

In one or more embodiments, the display device may include a plurality of touch electrodes overlapping the light blocking layer and spaced apart from the plurality of emission areas.

In one or more embodiments, an overlapping portion of the first color filter and the second color filter may be adjacent to the second emission area from a center of a touch electrode between the first emission area and the second emission area.

In one or more embodiments, an overlapping portion of the second color filter and the third color filter may be adjacent to the third emission area from a center of a touch electrode between the second emission area and the third emission area.

In one or more embodiments, the display device may further include a first transmission area between the first emission area and the third emission area adjacent to each other in the second direction, wherein the light blocking layer may include a fourth hole overlapping the first transmission area.

In one or more embodiments, a size of the fourth hole of the light blocking layer in the plan view may be larger than a size of the first transmission area in the plan view.

In one or more embodiments, each of the first color filter and the third color filter may do not overlap the first transmission area and the fourth hole, and a portion of the light blocking layer at edges of the fourth hole may be not covered by the color filters.

In one or more embodiments, respective edge portions of the first color filter and the third color filter in the second direction may be partially recessed inwardly along the edges of the fourth hole.

In one or more embodiments, the plurality of color filters may further include a plurality of second color filters spaced apart from each other in the first direction with the first transmission area therebetween, wherein the second color filters may not overlap the fourth hole of the light blocking layer.

In one or more embodiments, respective edge portions of the second color filters in the first direction may be partially recessed inwardly along edges of the fourth hole.

According to one or more embodiments of the present disclosure, a display device includes a display layer including a plurality of light emitting elements in a plurality of emission areas to emit light, a light blocking layer on the display layer and including a plurality of holes overlapping the plurality of emission areas, and a plurality of color filters in the plurality of holes and on the light blocking layer and overlapping the plurality of emission areas, wherein the plurality of color filters includes: a first color filter including a red color filter overlapping a first emission area, a second color filter including a green color filter overlapping a second emission area and a third color filter including a blue color filter overlapping a third emission area, wherein a portion of the second color filter is on an adjacent first color filter and a portion of the second color filter is on an adjacent third color filter on the light blocking layer, and a width of an overlapping portion of the second color filter and the first color filter or the third color filter is in a range of 37.5 to 125% of a maximum thickness of the second color filter.

In one or more embodiments, the plurality of holes of the light blocking layer may (e.g., combined or each) have a larger area than the (e.g., combined or corresponding one of the) plurality of emission areas, and the first color filter, the second color filter and the third color filter (e.g., combined or each) have a larger area than the (e.g., combined or corresponding one of the) plurality of holes.

In one or more embodiments, a thickness of the portion of the second color filter on the adjacent first color filter or the portion of the second color filter on the adjacent third color filter may be in a range of 12.5 to 75% of the maximum thickness of the second color filter.

In one or more embodiments, a portion of the third color filter may be on an adjacent first color filter on the light blocking layer.

In one or more embodiments, the display device may further include a touch electrode between the display layer and the light blocking layer and overlapping the light blocking layer, wherein the overlapping portion of the second color filter and the first color filter or the third color filter may be disposed to one side from a center of the touch electrode.

BRIEF DESCRIPTION OF THE DRAWINGS

These and other aspects, features and/or principles will become apparent and more readily appreciated from the following description of the embodiments, taken in conjunction with the accompanying drawings, in which.

DETAILED DESCRIPTION

Figure 1:
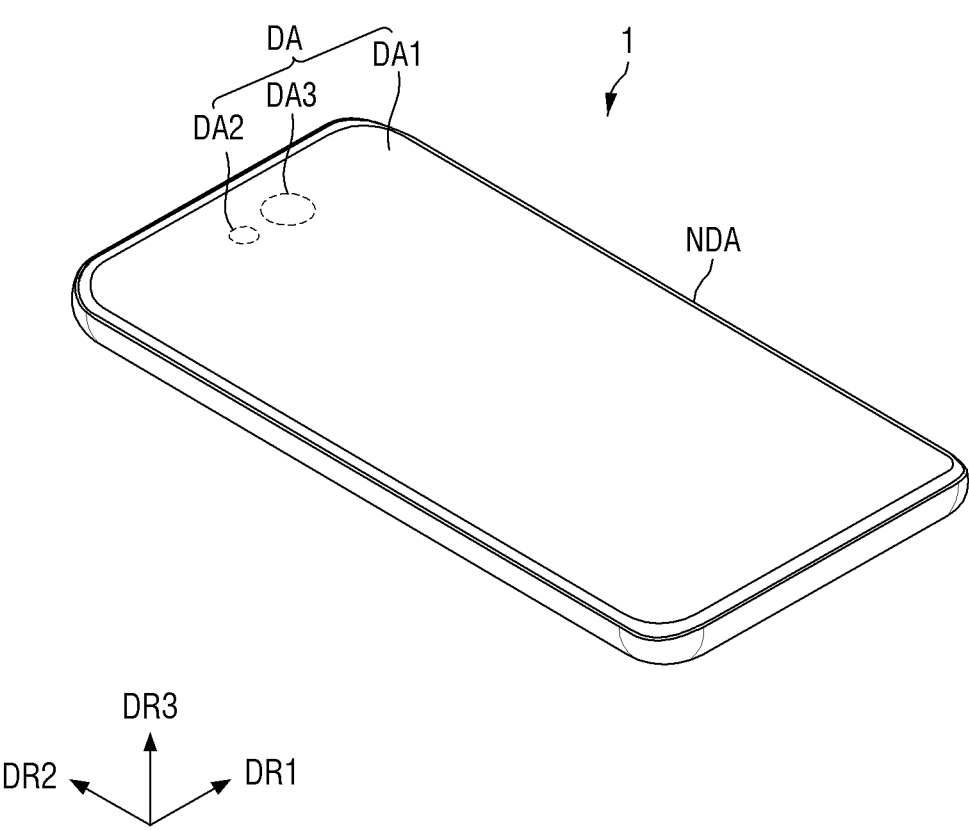
FIG. 1 is a schematic perspective view of an electronic device according to one or more embodiments of the present disclosure.

The present disclosure will now be described more fully hereinafter with reference to the accompanying drawings, in which certain embodiments of the present disclosure are shown. This present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Accordingly, processes, elements, and techniques that are not necessary to those having ordinary skill in the art for a complete understanding of the aspects and features of the present disclosure may not be described.

It will also be understood that when a layer is referred to as being "on" or "connected to" another layer or substrate, it can be directly on or connected to the other layer or substrate, or intervening layers may also be present. In addition, it will also be understood that when an element or layer is referred to as being "between" two elements or layers, it can be the only element or layer between the two elements or layers, or one or more intervening elements or layers may also be present.

Unless otherwise noted, like reference numerals denote like elements throughout the attached drawings and the written description, and thus, descriptions thereof may not be repeated. In the drawings, the relative sizes of elements, layers, and regions may be exaggerated for clarity.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Spatially relative terms, such as "below," "lower," "under," "above," "upper," and the like, may be used herein for ease of explanation to describe one element or feature's relationship to another element(s) or feature(s) as illustrated in the drawings. It will be understood that the spatially relative terms are intended to encompass different orientations of the device in use or in operation, in addition to the orientation depicted in the figures. For example, if the device in the drawings is turned over, elements described as "below" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

Hereinafter, embodiments will be described with reference to the accompanying drawings.

FIG. 1 is a schematic perspective view of an electronic device 1 according to one or more embodiments of the present disclosure.

Referring to FIG. 1, the electronic device 1 displays (e.g., may be to display) moving images or still images. The electronic device 1 may refer to any electronic device that provides a display screen. Examples of the electronic device 1 may include a television, a notebook computer, a monitor, a billboard, an Internet of things (IoT) device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game console, a digital camera and a camcorder, all of which provide a display screen.

The electronic device 1 may include a display device 10 (see FIG. 4) that provides a display screen. Examples of the display device 10 may include an inorganic light emitting diode display device, an organic light emitting display device, a quantum dot light emitting display device, a plasma display panel, and a field emission display device. A case where an organic light emitting diode display device is applied as an example of the display device 10 will be described in more detail below, but the present disclosure is not limited to this case, and other display devices can also be applied within the scope of the present disclosure.

The shape of the electronic device 1 can be variously modified. For example, the electronic device 1 may have one or more suitable shapes such as a horizontally long rectangle, a vertically long rectangle, a square, a quadrilateral with rounded corners (vertices), other polygons, or a circle. The shape of a display area DA of the electronic device 1 may also be similar to the overall shape of the electronic device 1. In FIG. 1, the electronic device 1 shaped like a rectangle that is long in a second direction DR2 is illustrated.

The electronic device 1 may include the display area DA and a non-display area NDA. The display area DA may be an area where a screen can be displayed, and the non-display area NDA may be an area where no screen is displayed. The display area DA may also be referred to as an active area, and the non-display area NDA may also be referred to as an inactive area. The display area DA may generally occupy a center of the electronic device 1.

The display area DA may include a first display area DA1, a second display area DA2, and a third display area DA3.

The second display area DA2 and the third display area DA3 are areas where components for adding one or more suitable functions to the electronic device 1 are disposed. The second display area DA2 and the third display area DA3 may be component areas.

Figure 2:
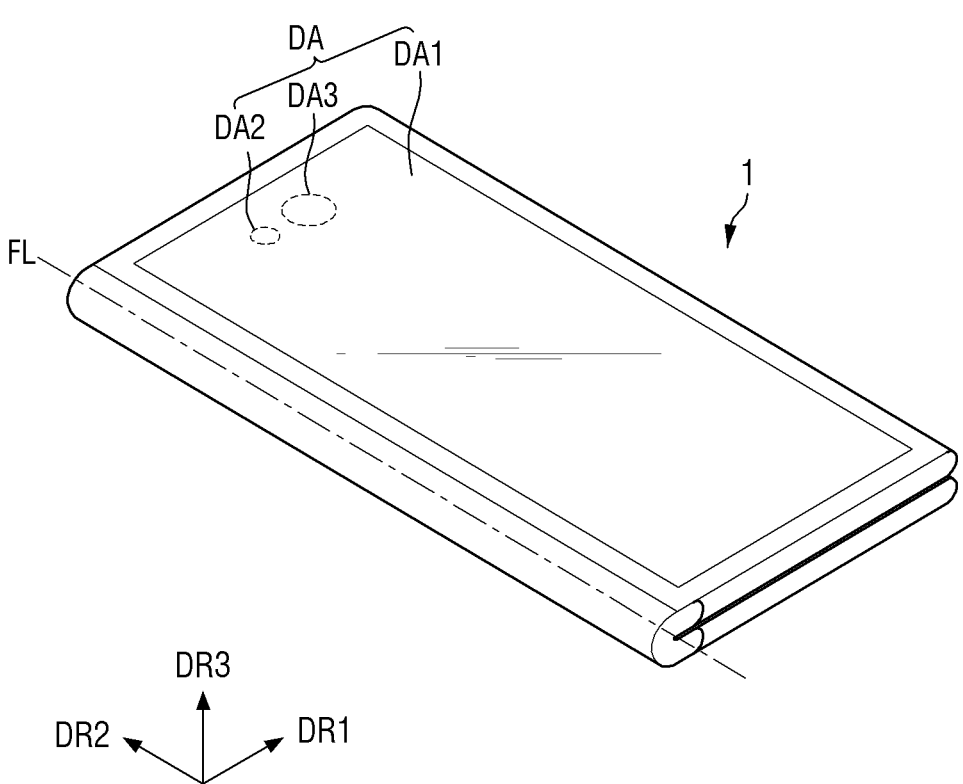
FIG. 2 is a schematic perspective view illustrating a folded state of a foldable electronic device according to one or more embodiments of the present disclosure.
Figure 3:
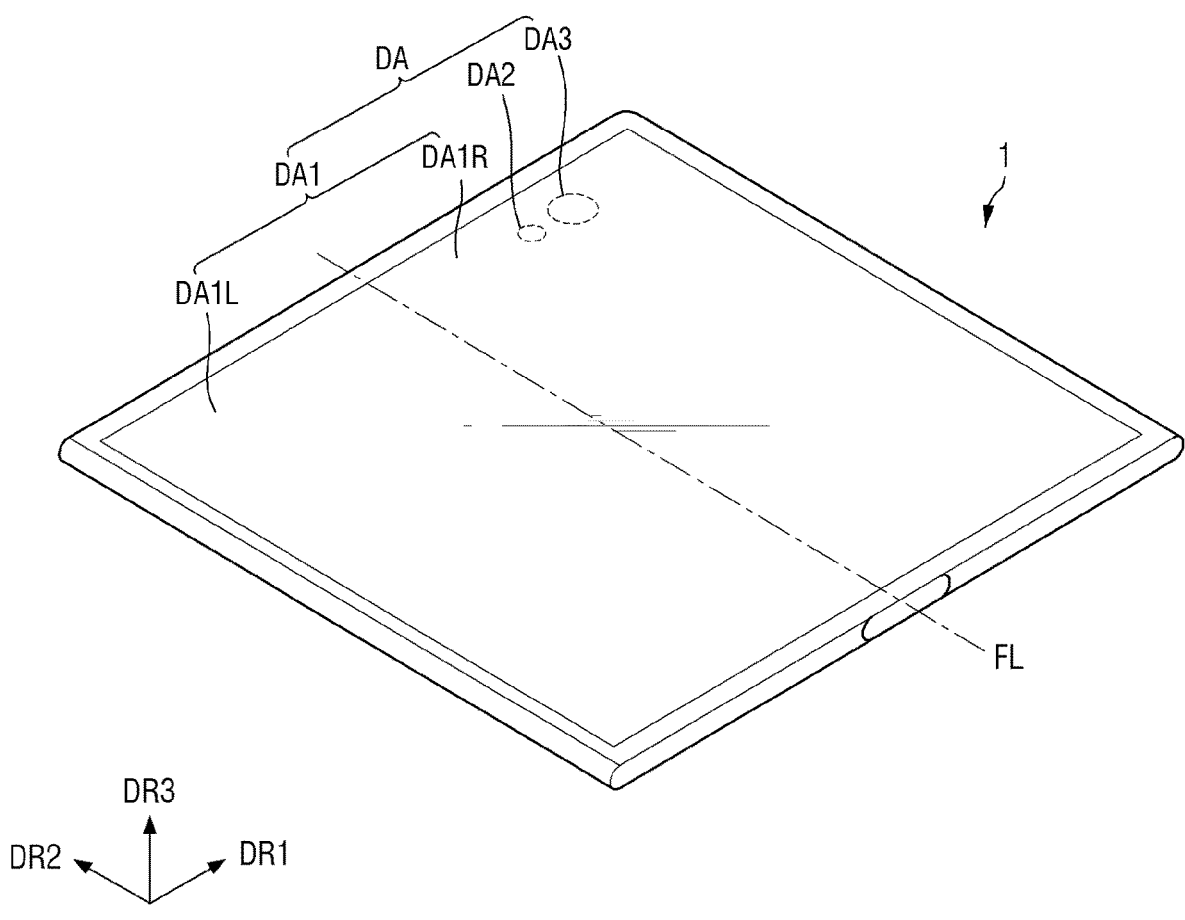
FIG. 3 is a schematic perspective view illustrating an unfolded state of the foldable electronic device of FIG. 2, according to one or more embodiments of the present disclosure.

FIG. 2 is a schematic perspective view illustrating a folded state of a foldable display device according to one or more embodiments of the present disclosure. FIG. 3 is a schematic perspective view illustrating an unfolded state of the foldable display device of FIG. 2, according to one or more embodiments.

Referring to FIGS. 2 and 3, the electronic device 1 according to one or more embodiments may be a foldable display device. The foldable electronic device 1 may be folded about a folding axis FL. A display area DA may be disposed on the outside and/or the inside of the foldable electronic device 1. In one or more embodiments, the display area DA is disposed on each of the outside and the inside of the foldable electronic device 1 of FIGS. 2 and 3.

The display area DA may be disposed on the outside of the electronic device 1. An outer surface of the folded electronic device 1 may include the display area DA, and an inner surface of the unfolded electronic device 1 may include the display area DA. In the foldable electronic device 1 of FIG. 3, the display area DA may include a first display area DA1 which occupies most of the display area DA and a second display area DA2 and a third display area DA3 which occupy a relatively smaller area than the first display area DA1. The first display area DA1 may include a first display unit DA1L and a second display unit DA1R located on both (e.g., simultaneously) sides of the folding axis FL. The second display area DA2 and the third display area DA3 may be disposed in an area where the second display unit DA1R is located. However, the present disclosure is not limited thereto. In one or more embodiments, the second display area DA2 and the third display area DA3 may be disposed in an area where the first display unit DA1L is located. In one or more embodiments, either of the second display area DA2 or the third display area DA3 may be disposed in the first display unit DA1L, and the other may be disposed in the second display unit DA1R.

As illustrated in FIGS. 1 through 3, each of the second display area DA2 and the third display area DA3 may have a smaller area than the first display area DA1. The second display area DA2 and the third display area DA3 may have different sizes or areas, but the present disclosure is not limited thereto. In the following drawings, a case where the second display area DA2 has a smaller area than the third display area DA3 will be described as an example. Each of the second display area DA2 and the third display area DA3 may be surrounded by the first display area DA1, but the present disclosure is not limited thereto.

Figure 4:
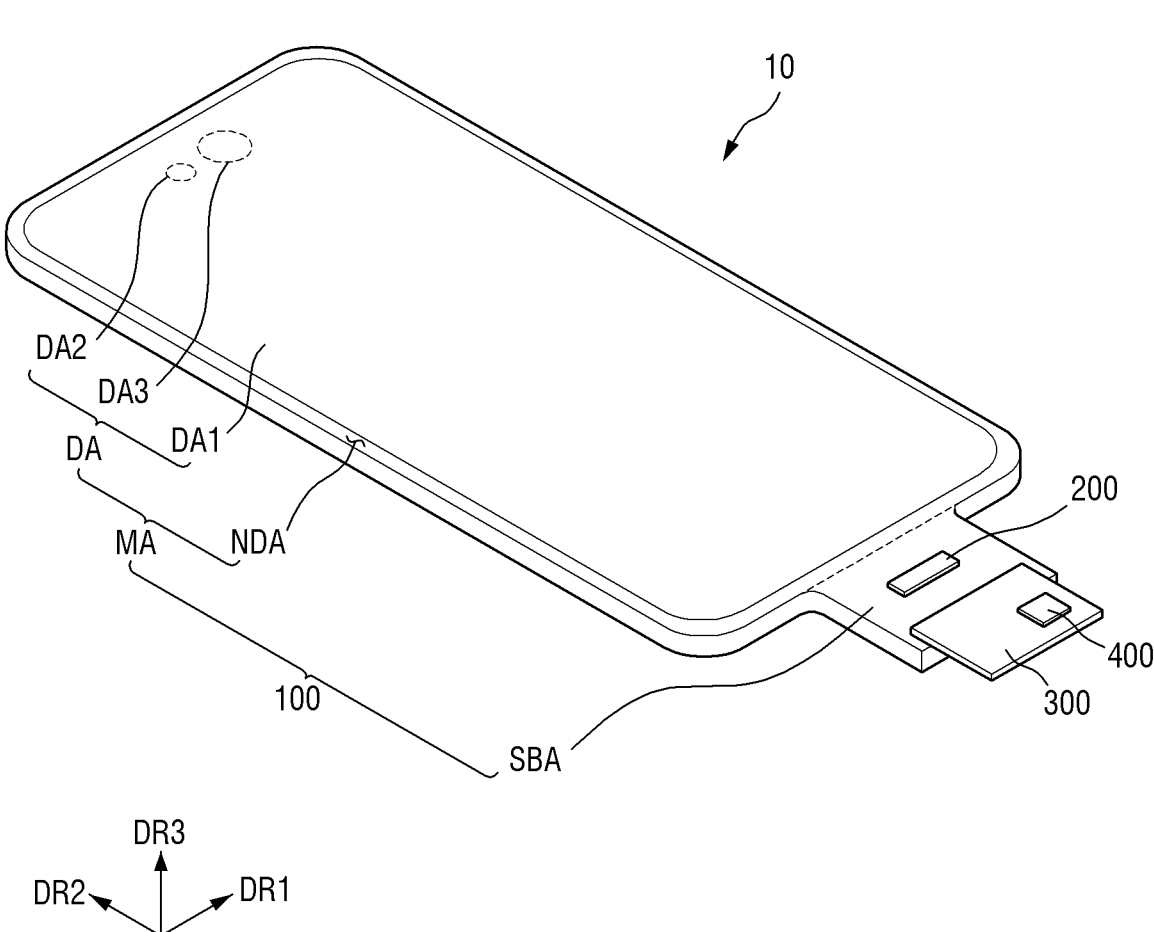
FIG. 4 is a schematic perspective view of a display device included in the electronic device according to one or more embodiments of the present disclosure.

FIG. 4 is a schematic perspective view of a display device 10 included in the electronic device 1 according to one or more embodiments of the present disclosure.

Referring to FIG. 4, the electronic device 1 according to one or more embodiments may include the display device 10. The display device 10 may provide a screen displayed by the electronic device 1. The display device 10 may have a planar shape similar to that of the electronic device 1. For example, the display device 10 may be shaped like a rectangular plane having short sides in a first direction DR1 and long sides in the second direction DR2. Each corner where a short side extending in the first direction DR1 meets a long side extending in the second direction DR2 may be rounded with a set or predetermined curvature. However, the present disclosure is not limited thereto, and each corner may also be right-angled. The planar shape of the display device 10 is not limited to a quadrilateral shape but may also be another polygonal shape, a circular shape, or an oval shape.

The display device 10 may include a display panel 100, a display driver 200, a circuit board 300, and a touch driver 400.

The display panel 100 may include a main area MA and a sub-area SBA.

The main area MA may include a display area DA including pixels that display an image and a non-display area NDA located around the display area DA. The display area DA may include a first display area DA1, a second display area DA2, and a third display area DA3. The display area DA may be to emit light from a plurality of emission areas or a plurality of opening areas. For example, the display panel 100 may include pixel circuits including switching elements, a pixel defining layer defining the emission areas or the opening areas, and self-light emitting elements.

For example, the self-light emitting elements may include at least one of, but not limited to, an organic light emitting diode including an organic light emitting layer, a quantum dot light emitting diode including a quantum dot light emitting layer, an inorganic light emitting diode including an inorganic semiconductor, and/or a micro-light emitting diode.

The non-display area NDA may be an area outside the display area DA. The non-display area NDA may be defined as an edge area of the main area MA of the display panel 100. The non-display area NDA may include a gate driver supplying gate signals to gate lines and fan-out lines connecting the display driver 200 and the display area DA.

The sub-area SBA may be an area extending from a side of the main area MA. The sub-area SBA may include a flexible material that can be bent, folded, rolled, etc. For example, when the sub-area SBA is bent, it may be overlapped by the main area MA in a thickness direction (a third direction DR3). The sub-area SBA may include the display driver 200 and a pad unit connected to the circuit board 300. In one or more embodiments, the sub-area SBA may not be provided, and the display driver 200 and the pad unit may be disposed in the non-display area NDA.

The display driver 200 may output signals and voltages for driving the display panel 100. The display driver 200 may supply data voltages to data lines. The display driver 200 may supply a power supply voltage to a power line and supply a gate control signal to the gate driver. The display driver 200 may be formed as an integrated circuit and mounted on the display panel 100 by a chip on glass (COG) method, a chip on plastic (COP) method, or an ultrasonic bonding method. For example, the display driver 200 may be disposed in the sub-area SBA and may be overlapped by the main area MA in the thickness direction by the bending of the sub-area SBA. As another example, the display driver 200 may be mounted on the circuit board 300.

The circuit board 300 may be attached onto the pad unit of the display panel 100 utilizing an anisotropic conductive film. Lead lines of the circuit board 300 may be electrically connected to the pad unit of the display panel 100. The circuit board 300 may be a flexible printed circuit board, a printed circuit board, or a flexible film such as a chip on film.

The touch driver 400 may be mounted on the circuit board 300. The touch driver 400 may be connected to a touch sensing unit of the display panel 100. The touch driver 400 may supply a touch driving signal to a plurality of touch electrodes of the touch sensing unit and sense a change in capacitance between the touch electrodes. For example, the touch driving signal may be a pulse signal having a set or predetermined frequency. The touch driver 400 may calculate whether an input has been made and coordinates of the input based on a change in capacitance between the touch electrodes. The touch driver 400 may be formed as an integrated circuit.

Figure 5:
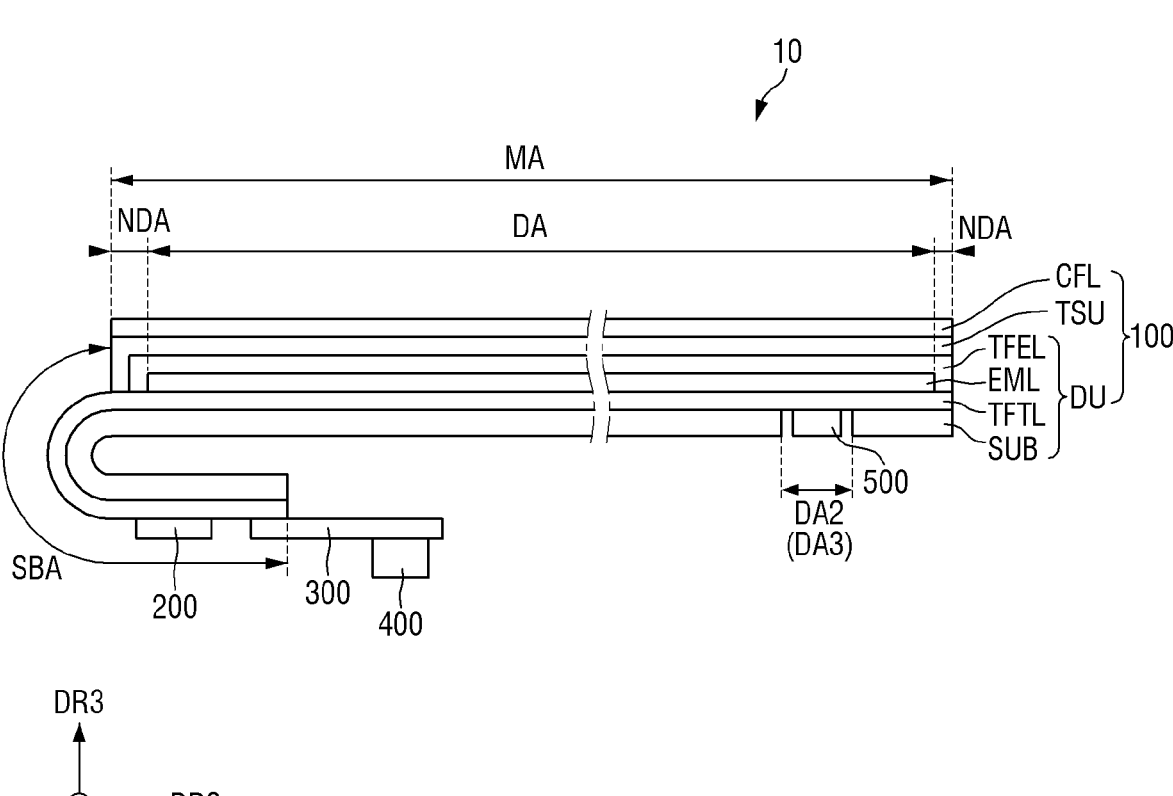
FIG. 5 is a cross-sectional view of the display device of FIG. 4 as viewed from the side, according to one or more embodiments of the present disclosure.

FIG. 5 is a cross-sectional view of the display device 10 of FIG. 4 as viewed from the side, according to one or more embodiments of the present disclosure.

Referring to FIG. 5, the display panel 100 may include a display layer DU, a touch sensing layer TSU, and a color filter layer CFL. The display layer DU may include a substrate SUB, a thin-film transistor layer TFTL, a light emitting element layer EML, and an encapsulation layer TFEL.

The substrate SUB may be a base substrate or a base member. The substrate SUB may be a flexible substrate that can be bent, folded, rolled, etc. For example, the substrate SUB may include polymer resin such as polyimide (PI). However, the present disclosure is not limited thereto. In one or more embodiments, the substrate SUB may include a glass material or a metal material.

The thin-film transistor layer TFTL may be disposed on the substrate SUB. The thin-film transistor layer TFTL may include a plurality of thin-film transistors constituting pixel circuits of pixels. The thin-film transistor layer TFTL may further include gate lines, data lines, power lines, gate control lines, fan-out lines connecting the display driver 200 and the data lines, and/or lead lines connecting the display driver 200 and the pad unit. Each of the thin-film transistors may include a semiconductor region, a source electrode, a drain electrode, and/or a gate electrode. For example, when the gate driver is formed on a side of the non-display area NDA of the display panel 100, it may include thin-film transistors.

The thin-film transistor layer TFTL may be disposed in the display area DA, the non-display area NDA, and the sub-area SBA. The thin-film transistors of the pixels, the gate lines, the data lines, and the power lines of the thin-film transistor layer TFTL may be disposed in the display area DA. The gate control lines and the fan-out lines of the thin-film transistor layer TFTL may be disposed in the non-display area NDA. The lead lines of the thin-film transistor layer TFTL may be disposed in the sub-area SBA.

The light emitting element layer EML may be disposed on the thin-film transistor layer TFTL. The light emitting element layer EML may include a plurality of light emitting elements, each including a first electrode, a second electrode and a light emitting layer to emit light, and a pixel defining layer defining the pixels. The light emitting elements of the light emitting element layer EML may be disposed in the display area DA.

In one or more embodiments, the light emitting layer may be an organic light emitting layer including an organic material. The light emitting layer may include a hole transporting layer, an organic light emitting layer, and an electron transporting layer. When the first electrode receives a voltage through a thin-film transistor of the thin-film transistor layer TFTL and the second electrode receives a cathode voltage, holes and electrons may move to the organic light emitting layer through the hole transporting layer and the electron transporting layer, respectively, and may combine together in the organic light emitting layer to emit light.

In one or more embodiments, the light emitting elements may include a quantum dot light emitting diode including a quantum dot light emitting layer, an inorganic light emitting diode including an inorganic semiconductor, or a micro-light emitting diode.

The encapsulation layer TFEL may cover upper and side surfaces of the light emitting element layer EML and may protect the light emitting element layer EML. The encapsulation layer TFEL may include at least one inorganic layer and at least one organic layer to encapsulate the light emitting element layer EML.

The touch sensing layer TSU may be disposed on the encapsulation layer TFEL. The touch sensing layer TSU may include a plurality of touch electrodes for sensing a user's touch in a capacitive manner and touch lines connecting the touch electrodes and the touch driver 400. For example, the touch sensing layer TSU may sense a user's touch in a mutual capacitance manner or a self-capacitance manner.

In one or more embodiments, the touch sensing layer TSU may be disposed on a separate substrate disposed on the display layer DU. In this case, the substrate supporting the touch sensing layer TSU may be a base member that encapsulates the display layer DU.

The touch electrodes of the touch sensing layer TSU may be disposed in a touch sensor area overlapping the display area DA. The touch lines of the touch sensing layer TSU may be disposed in a touch peripheral area overlapping the non-display area NDA.

The color filter layer CFL may be disposed on the touch sensing layer TSU. The color filter layer CFL may include a plurality of color filters corresponding to a plurality of emission areas, respectively. Each of the color filters may selectively transmit light of a specific wavelength and block or absorb light of other wavelengths. The color filter layer CFL may be to absorb a portion of light introduced from the outside of the display device 10 to reduce reflected light due to the external light. Therefore, the color filter layer CFL can prevent or reduce color distortion due to reflection of the external light.

Because the color filter layer CFL is directly disposed on the touch sensing layer TSU, the display device 10 may not require a separate substrate for the color filter layer CFL. Therefore, a thickness of the display device 10 may be relatively small.

In one or more embodiments, the display device 10 may further include an optical device 500. The optical device 500 may be disposed in the second display area DA2 or the third display area DA3. The optical device 500 may be to emit or receive light in infrared, ultraviolet, and visible light bands. For example, the optical device 500 may be an optical sensor that senses light incident on the display device 10, such as a proximity sensor, an illuminance sensor, a camera sensor or an image sensor.

Figure 6:
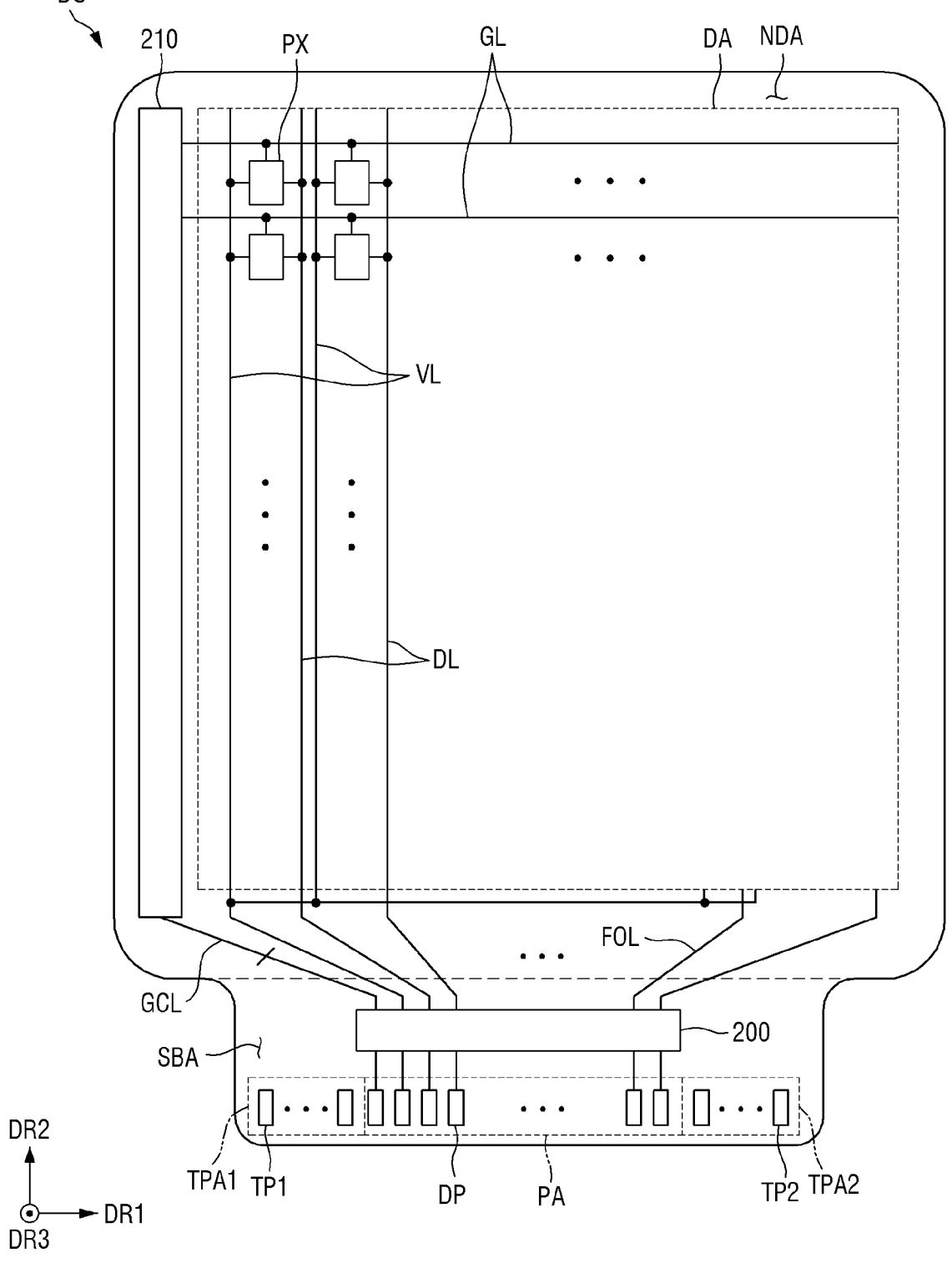
FIG. 6 is a plan view of a display layer of a display device according to one or more embodiments of the present disclosure.

FIG. 6 is a plan view of a display layer DU of a display device 10 according to one or more embodiments of the present disclosure.

Referring to FIG. 6, the display layer DU may include a display area DA and a non-display area NDA.

The display area DA may be disposed in a center of a display panel 100. The display area DA may include a plurality of pixels PX, a plurality of gate lines GL, a plurality of data lines DL, and a plurality of power lines VL. Each of the pixels PX may be defined as a minimum unit that outputs light.

The gate lines GL may supply gate signals received from a gate driver 210 to the pixels PX. The gate lines GL may extend in the first direction DR1 and may be spaced apart (e.g., separate) from each other in the second direction DR2 intersecting the first direction DR1.

The data lines DL may supply data voltages received from a display driver 200 to the pixels PX. The data lines DL may extend in the second direction DR2 and may be spaced apart (e.g., separate) from each other in the first direction DR1.

The power lines VL may supply a power supply voltage received from the display driver 200 to the pixels PX. Here, the power supply voltage may be at least one of a driving voltage, an initialization voltage, a reference voltage, and/or a low-potential voltage. The power lines VL may extend in the second direction DR2 and may be spaced apart (e.g., separate) from each other in the first direction DR1.

The non-display area NDA may surround the display area DA. The non-display area NDA may include the gate driver 210, fan-out lines FOL, and gate control lines GCL. The gate driver 210 may generate a plurality of gate signals based on a gate control signal and sequentially supply the gate signals to the gate lines GL according to a set order.

The fan-out lines FOL may extend from the display driver 200 to the display area DA. The fan-out lines FOL may supply data voltages received from the display driver 200 to the data lines DL.

The gate control lines GCL may extend from the display driver 200 to the gate driver 210. The gate control lines GCL may supply a gate control signal received from the display driver 200 to the gate driver 210.

The sub-area SBA may include the display driver 200, a pad area PA, and first and second touch pad areas TPA1 and TPA2.

The display driver 200 may output signals and voltages for driving the display panel 100 to the fan-out lines FOL. The display driver 200 may supply data voltages to the data lines DL through the fan-out lines FOL. The data voltages may be supplied to the pixels PX and may determine luminances of the pixels PX. The display driver 200 may supply a gate control signal to the gate driver 210 through the gate control lines GCL.

The pad area PA, the first touch pad area TPA1, and the second touch pad area TPA2 may be disposed at an edge of a sub-area SBA. The pad area PA, the first touch pad area TPA1, and the second touch pad area TPA2 may be electrically connected to a circuit board 300 utilizing an anisotropic conductive film or a low-resistance high-reliability material such as self-assembly anisotropic conductive paste (SAP).

The pad area PA may include a plurality of display pad units DP. The display pad units DP may be connected to a graphics system through the circuit board 300. The display pad units DP may be connected to the circuit board 300 to receive digital video data and may supply the digital video data to the display driver 200.

Figure 7:
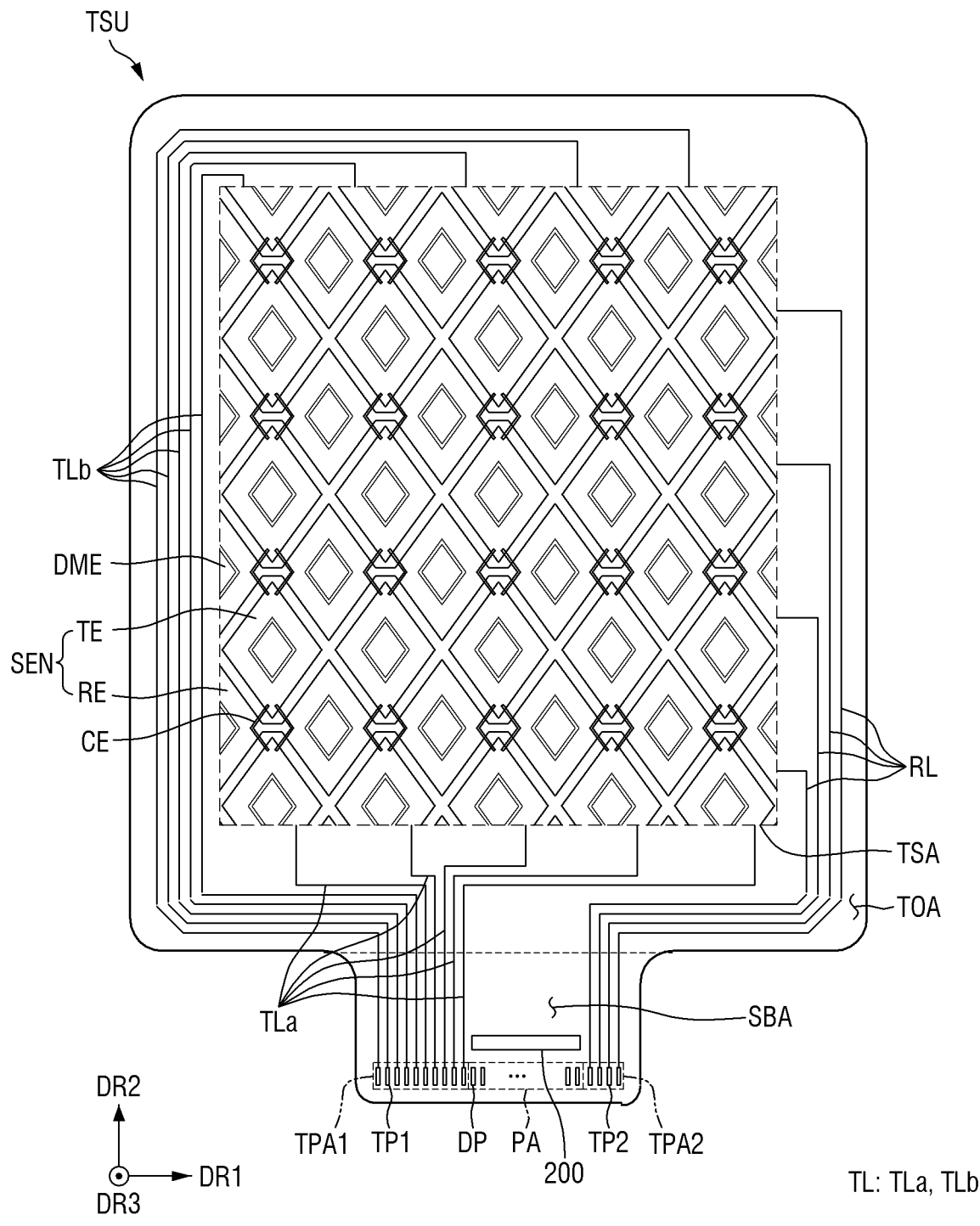
FIG. 7 is a plan view of a touch sensing layer of the display device according to one or more embodiments of the present disclosure.

FIG. 7 is a plan view of a touch sensing layer TSU of the display device 10 of FIG. 6, according to one or more embodiments of the present disclosure.

Referring to FIG. 7, the touch sensing layer TSU may include a touch sensor area TSA for sensing a user's touch and a touch peripheral area TOA disposed around the touch sensor area TSA. The touch sensor area TSA may be disposed in the display area DA of the display device 10, and the touch peripheral area TOA may be disposed in the non-display area NDA of the display device 10.

The touch sensor area TSA may include a plurality of touch electrodes SEN and a plurality of dummy electrodes DME. The touch electrodes SEN may form mutual capacitance or self-capacitance to sense a touch of an object or a person. The touch electrodes SEN may include a plurality of driving electrodes TE and a plurality of sensing electrodes RE.

The driving electrodes TE may be arranged in the first direction DR1 and the second direction DR2. The driving electrodes TE may be spaced apart (e.g., separate) from each other in the first direction DR1 and the second direction DR2. The driving electrodes TE adjacent to each other in the second direction DR2 may be electrically connected through bridge electrodes CE.

The driving electrodes TE may be connected to first touch pad units TP1 through driving lines TL. The driving lines TL may include lower driving lines Tla and upper driving lines TLb. For example, driving electrodes TE disposed on a lower side of the touch sensor area TSA may be connected to the first touch pad units TP1 through the lower driving lines Tla, and driving electrodes TE disposed on an upper side of the touch sensor area TSA may be connected to the first touch pad units TP1 through the upper driving lines TLb. The lower driving lines Tla may extend to the first touch pad units TP1 via a lower side of the touch peripheral area TOA. The upper driving lines TLb may extend to the first touch pad units TP1 via upper, left and lower sides of the touch peripheral area TOA. The first touch pad units TP1 may be connected to a touch driver 400 (shown, for example, in FIG. 5) through the circuit board 300.

The bridge electrodes CE may be bent at least once. For example, each of the bridge electrodes CE may be shaped like a bracket ("<" or ">"), but the planar shape of each of the bridge electrodes CE is not limited thereto. The driving electrodes TE adjacent to each other in the second direction DR2 may be connected by a plurality of bridge electrodes CE. Therefore, even if any one of the bridge electrodes CE is broken, the driving electrodes TE may be stably connected through the other bridge electrode(s) CE. The driving electrodes TE adjacent to each other may be connected by two bridge electrodes CE, but the number of the bridge electrodes CE is not limited thereto.

The bridge electrodes CE may be disposed on a different layer from the driving electrodes TE and the sensing electrodes RE. The sensing electrodes RE adjacent to each other in the first direction DR1 may be electrically connected through a connection portion disposed on the same layer as the driving electrodes TE or the sensing electrodes RE. The driving electrodes TE adjacent to each other in the second direction DR2 may be electrically connected through the bridge electrodes CE disposed on a different layer from the driving electrodes TE or the sensing electrodes RE. Therefore, even when the bridge electrodes CE overlap the sensing electrodes RE in the Z-axis direction (e.g. the thickness direction or third direction DR3 or in a plan view), the driving electrodes TE and the sensing electrodes RE may be insulated from each other. Mutual capacitance may be formed between the driving electrodes TE and the sensing electrodes RE.

The sensing electrodes RE may extend in the first direction DR1 and may be spaced apart (e.g., separate) from each other in the second direction DR2. The sensing electrodes RE may be arranged in the first direction DR1 and the second direction DR2, and the sensing electrodes RE adjacent to each other in the first direction DR1 may be electrically connected through a connection portion.

The sensing electrodes RE may be connected to second touch pad units TP2 through sensing lines RL. For example, sensing electrodes RE disposed on a right side of the touch sensor area TSA may be connected to the second touch pad units TP2 through the sensing lines RL. The sensing lines RL may extend to the second touch pad units TP2 via the right and lower sides of the touch peripheral area TOA. The second touch pad units TP2 may be connected to the touch driver 400 through the circuit board 300.

Each of the dummy electrodes DME may be surrounded by one or more driving electrodes TE or one or more sensing electrodes RE. Each of the dummy electrodes DME may be spaced apart (e.g., separate) and insulated from the driving electrodes TE or the sensing electrodes RE. Therefore, the dummy electrodes DME may be electrically floating.

The pad area PA, the first touch pad area TPA1, and the second touch pad area TPA2 may be disposed at an edge of the sub-area SBA. The pad area PA, the first touch pad area TPA1, and the second touch pad area TPA2 may be electrically connected to the circuit board 300 utilizing an anisotropic conductive film or a low-resistance high-reliability material such as self-assembly anisotropic conductive paste (SAP).

The first touch pad area TPA1 may be disposed on a side of the pad area PA and may include a plurality of first touch pad units TP1. The first touch pad units TP1 may be electrically connected to the touch driver 400 disposed on the circuit board 300. The first touch pad units TP1 may supply touch driving signals to the driving electrodes TE through the driving lines TL.

The second touch pad area TPA2 may be disposed on the other side of the pad area PA and may include a plurality of second touch pad units TP2. The second touch pad units TP2 may be electrically connected to the touch driver 400 disposed on the circuit board 300. The touch driver 400 may receive touch sensing signals through the sensing lines RL connected to the second touch pad units TP2 and sense a change in mutual capacitance between the driving electrodes TE and the sensing electrodes RE.

In one or more embodiments, the touch driver 400 may supply a touch driving signal to each of the driving electrodes TE and the sensing electrodes RE and receive a touch sensing signal from each of the driving electrodes TE and the sensing electrodes RE. The touch driver 400 may sense the amount of charge change of each of the driving electrodes TE and the sensing electrodes RE based on the touch sensing signal.

Figure 8:
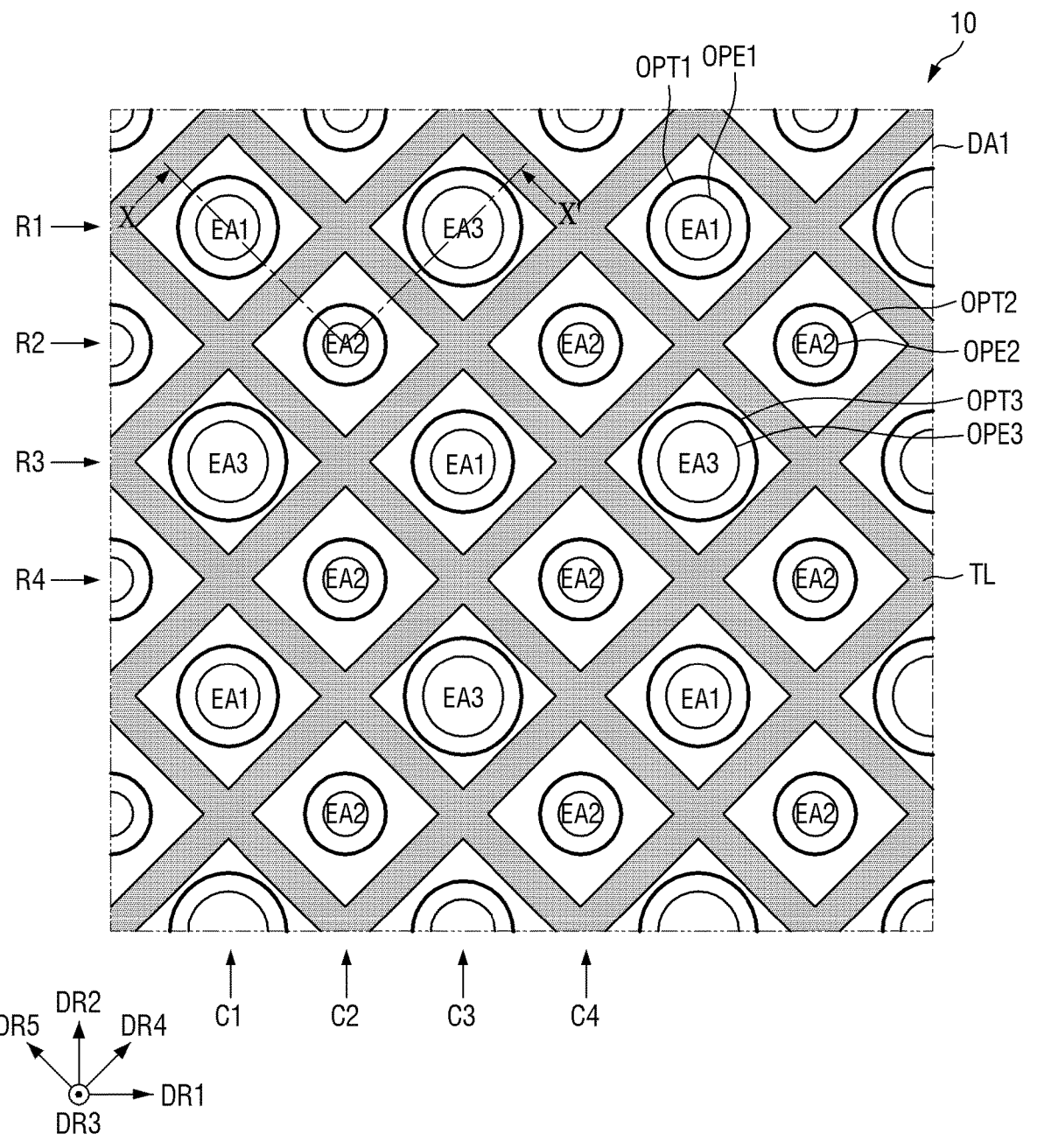
FIG. 8 is a plan view illustrating the arrangement of emission areas in a first display area of the display device according to one or more embodiments of the present disclosure.
Figure 9:
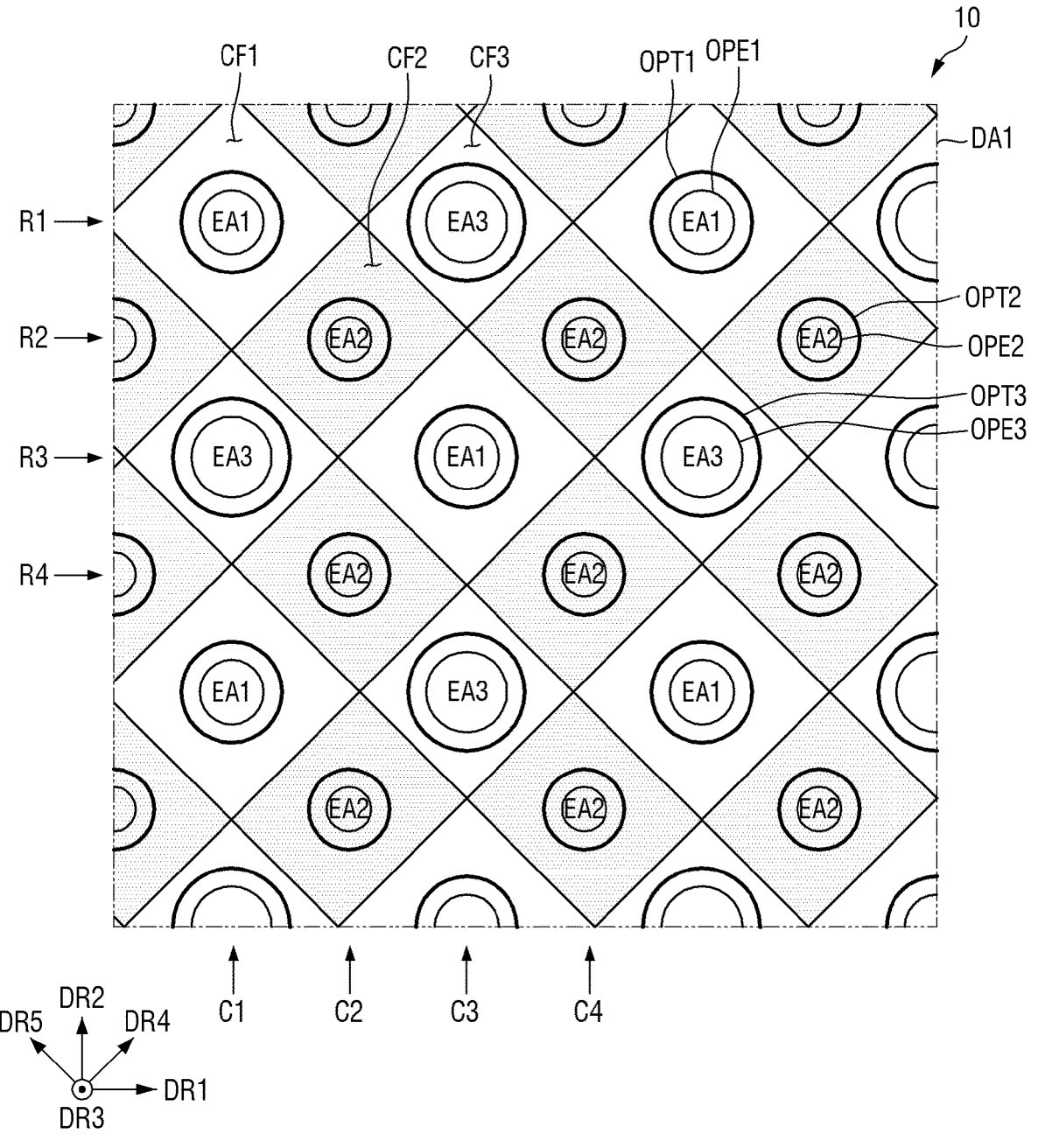
FIG. 9 is a plan view illustrating the arrangement of color filters in the first display area of FIG. 8, according to one or more embodiments of the present disclosure.

FIG. 8 is a plan view illustrating the arrangement of emission areas EA1 through EA3 in a first display area DA1 of the display device 10 of FIG. 6, according to one or more embodiments of the present disclosure. FIG. 9 is a plan view illustrating the arrangement of color filters CF1 through CF3 in the first display area DA1 of FIG. 8, according to one or more embodiments of the present disclosure.

Referring to FIGS. 8 and 9, the display device 10 may include a plurality of emission areas EA1 through EA3 disposed in the display area DA. The display area DA illustrated in FIGS. 8 and 9 may be the first display area DA1, and the emission areas EA1 through EA3 may be disposed in the first display area DA1. However, as will be described later, the emission areas EA1 through EA3 may also be disposed in a second display area DA2 and a third display area DA3 of the display area DA.

The emission areas EA1 through EA3 may include first emission areas EA1, second emission areas EA2, and third emission areas EA3 that emit light of different colors. The first through third emission areas EA1 through EA3 may be to emit red light, green light and blue light, respectively, and the color of light emitted from each of the emission areas EA1 through EA3 may vary according to the type or kind of light emitting element ED (see, e.g., FIG. 10) disposed in a light emitting element layer EML which will be described later. In one or more embodiments, the first emission areas EA1 may be to emit red first light, the second emission areas EA2 may be to emit green second light, and the third emission areas EA3 may be to emit blue third light. However, the present disclosure is not limited thereto.

The emission areas EA1 through EA3 may be arranged in a PenTile®, or a Diamond Pixel™. PENTILE® is a duly registered trademark of Samsung Display Co., Ltd. And Diamond Pixel™ is a trademark of Samsung Display Co., Ltd. For example, the first emission areas EA1 and the third emission areas EA3 may be spaced apart (e.g., separate) from each other in the first direction DR1 and may be alternately disposed in the first direction DR1 and the second direction DR2. In the arrangement of the emission areas EA1 through EA3, the first emission areas EA1 and the third emission areas EA3 may be alternately disposed in the first direction DR1 in a first row R1 and a third row R3. The first emission areas EA1 and the third emission areas EA3 may be alternately disposed in the second direction DR2 in a first column C1 and a third column C3.

Each of the second emission areas EA2 may be spaced apart (e.g., separate) from other adjacent second emission areas EA2 in the first direction DR1 and the second direction DR2 and may be spaced apart (e.g., separate) from adjacent first and third emission areas EA1 and EA3 in a fourth direction DR4 or a fifth direction DR5. The second emission areas EA2 may be repeatedly disposed along the first direction DR1 and the second direction DR2. The second emission areas EA2 and the first emission areas EA1 or the second emission areas EA2 and the third emission areas EA3 may be alternately disposed along the fourth direction DR4 or the fifth direction DR5. In the arrangement of the emission areas EA1 through EA3, the second emission areas EA2 may be repeatedly disposed in the first direction DR1 in a second row R2 and a fourth row R4 and may be repeatedly disposed in the second direction DR2 in a second column C2 and a fourth column C4.

The first through third emission areas EA1 through EA3 may be respectively defined by a plurality of openings OPE1 through OPE3 formed in a pixel defining layer PDL (see, e.g., FIG. 10) of the light emitting element layer EML which will be described in more detail later. For example, the first emission areas EA1 may be defined by first openings OPE1 of the pixel defining layer PDL, the second emission areas EA2 may be defined by second openings OPE2 of the pixel defining layer PDL, and the third emission areas EA3 may be defined by third openings OPE3 of the pixel defining layer PDL.

In one or more embodiments, the areas or sizes of the first through third emission areas EA1 through EA3 may be different from each other. In the embodiment(s) of FIG. 8, the area of each third emission area EA3 may be larger than the area of each first emission area EA1 and the area of each second emission area EA2, and the area of each first emission area EA1 may be larger the area of each second emission area EA2. The areas of the emission areas EA1 through EA3 may vary according to the sizes of the openings OPE1 through OPE3 formed in the pixel defining layer PDL. The intensity of light emitted from each of the emission areas EA1 through EA3 may vary according to the area of the emission areas EA1, EA2 or EA3, and the color of a screen displayed on the display device 10 or the electronic device 1 may be controlled or selected by adjusting the areas of the emission areas EA1 through EA3. Although the area of each third emission area EA3 is the largest in the embodiment(s) of FIG. 8, the present disclosure is not limited thereto. The areas of the emission areas EA1 through EA3 may be freely adjusted according to the color of the screen required by the display device 10 and the electronic device 1. In one or more embodiments, the areas of the emission areas EA1 through and EA3 may be related to light efficiency, the life of light emitting elements ED, etc. and may have a trade-off relationship with reflection by external light. The areas of the emission areas EA1 through EA3 may be adjusted in consideration of the above factors.

In the display device 10 in which the emission areas EA1 through EA3 are arranged as illustrated in FIG. 8, one first emission area EA, two second emission areas EA2, and one third emission area EA3 adjacent to each other may form one pixel group. One pixel group may include the emission areas EA1 through EA3 emitting light of different colors to express a white gray level. However, the present disclosure is not limited thereto, and a combination of the emission areas EA1 through EA3 constituting one pixel group can be variously modified according to the arrangement of the emission areas EA1 through EA3 and the colors of light emitted from the emission areas EA1 through EA3.

The display device 10 may include a plurality of color filters CF1 through CF3 disposed in the emission areas EA1 through EA3. The color filters CF1 through CF3 may be disposed to correspond to the emission areas EA1 through EA3, respectively. For example, the color filters CF1 through CF3 may be disposed on a light blocking layer BM (see, e.g., FIG. 10) including a plurality of holes OPT1 through OPT3 which correspond to the emission areas EA1 through EA3 or the openings OPE1 through OPE3. The holes OPT1 through OPT3 of the light blocking layer BM may be formed to overlap the openings OPE1 through OPE3 and may form light output areas through which light emitted from the emission areas EA1 through EA3 is output. The color filters CF1 through CF3 may have a larger area than the holes OPT1 through OPT3 of the light blocking layer BM and the openings OPE1 through OPE3, respectively. The color filters CF1 through CF3 may completely cover the light output areas formed by the holes OPT1 through OPT3, respectively.

The color filters CF1 through CF3 may include first color filters CF1, second color filters CF2, and third color filters CF3 disposed to correspond to the different emission areas EA1 through EA3, respectively. Each of the color filters CF1 through CF3 may include a colorant such as a dye or a pigment that absorbs light in wavelength bands other than light in a specific wavelength band and may be disposed to correspond to the color of light emitted from each of the emission areas EA1 through EA3, respectively. For example, the first color filters CF1 may be red color filters that overlap the first emission areas EA1 and transmit only the red first light. The second color filters CF2 may be green color filters that overlap the second emission areas EA2 and transmit only the green second light. The third color filters CF3 may be blue color filters that overlap the third emission areas EA3 and transmit only the blue third light.

Like the emission areas EA1 through EA3, the color filters CF1 through CF3 may be arranged in a PenTile® or a Diamond Pixel™. For example, the first color filters CF1 and the third color filters CF3 may be alternately disposed in the first direction DR1 and the second direction DR2. In the arrangement of the color filters CF1 through CF3, the first color filters CF1 and the third color filters CF3 may be alternately disposed in the first direction DR1 in the first row R1 and the third row R3. The first color filters CF1 and the third color filters CF3 may be alternately disposed in the second direction DR2 in the first column C1 and the third column C3.

Each of the second color filters CF2 may be arranged with other second color filters CF2 in the first direction DR1 and the second direction DR2 and may be arranged with adjacent first and third color filters CF1 and CF3 in the fourth direction DR4 or the fifth direction DR5. The second color filters CF2 may be repeatedly disposed along the first direction DR1 and the second direction DR2. The second color filters CF2 and the first color filters CF1 or the second color filters CF2 and the third color filters CF3 may be alternately disposed along the fourth direction DR4 or the fifth direction DR5. In the arrangement of the color filters CF1 through CF3, the second color filters CF2 may be repeatedly disposed in the first direction DR1 in the second row R2 and the fourth row R4 and may be repeatedly disposed in the second direction DR2 in the second column C2 and the fourth column C4.

According to one or more embodiments, each of the color filters CF1 through CF3 may partially overlap other adjacent color filters CF1 through CF3. Although adjacent color filters CF1 through CF3 are in contact with each other in FIG. 9, they may also partially overlap each other at a boundary between them as will be described in more detail later. FIG. 9 shows the arrangement of the color filters CF1 through CF3 as viewed from above. It may be understood that in embodiments in which edges of adjacent color filters CF1, CF2 or CF3 among the color filters CF1 through CF3 overlap each other, the edges of an adjacent color filter CF1, CF2, or CF3 may be covered by another color filter CF1, CF2 or CF3 that is disposed on the color filter CF1, CF2 or CF3. The areas in which color filters CF1 through CF3 different from each other overlap may be areas not overlapping the emission areas EA1 through EA3 and they may overlap each other on the light blocking layer BM which will be described in more detail later.

Because the color filters CF1 through CF3 overlap each other in the display device 10, the intensity of reflected light due to external light can be reduced. Further, the color of reflected light due to external light can be controlled or selected by adjusting the arrangement, shapes, and areas of the color filters CF1 through CF3 in a plan view. This will be described in more detail later with reference to other drawings.

A touch electrode TL may be disposed between the emission areas EA1 through EA3. The touch electrode TL may extend in the fourth direction DR4 and the fifth direction DR5 and may not overlap the emission areas EA1 through EA3 but may be spaced apart (e.g., separate) from the emission areas EA1 through EA3. The touch electrode TL may overlap the pixel defining layer PDL (see, e.g., FIG. 10) including the openings OPE1 through OPE3 and the light blocking layer BM (see, e.g., FIG. 10) including the holes OPT1 through OPT3 which will be described in more detail later. Although the touch electrode TL is schematically illustrated in FIG. 8, it may be either a touch driving electrode TE or a sensing electrode RE of FIG. 7.

Figure 10:
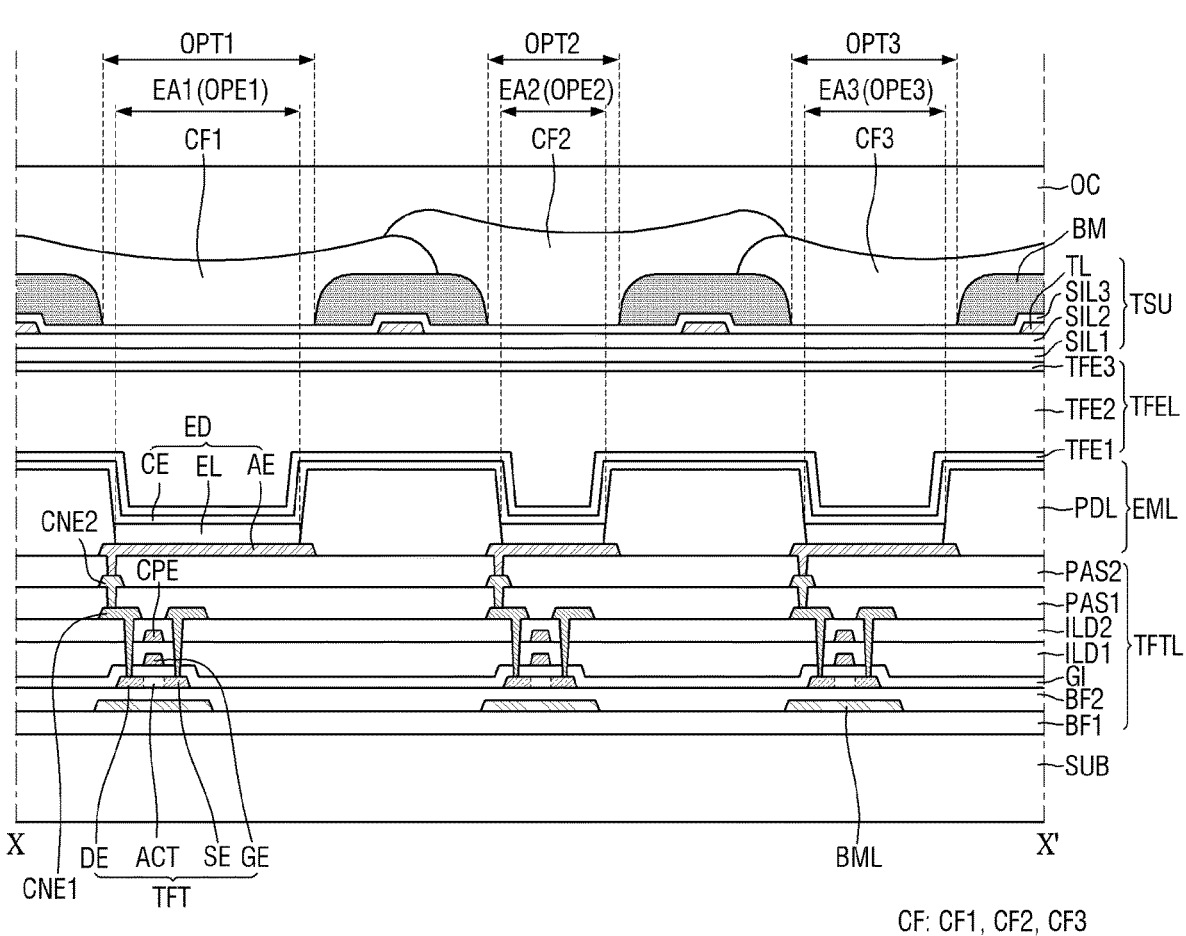
FIG. 10 is a cross-sectional view taken along line X-X' of FIG. 8, according to one or more embodiments of the present disclosure.

FIG. 10 is a cross-sectional view taken along line X-X' of FIG. 8, according to one or more embodiments of the present disclosure. FIG. 10 illustrates a cross-section across a first emission area EA1, a second emission area EA2, and a third emission area EA3.

The cross-sectional structure of the display device 10 will be described with reference to FIG. 10 in addition to FIGS. 8 and 9. The display panel 100 of the display device 10 may include the display layer DU, the touch sensing layer TSU, and a color filter layer CFL. The display layer DU may include a substrate SUB, a thin-film transistor layer TFTL, the light emitting element layer EML, and an encapsulation layer TFEL. The display panel 100 may include the light blocking layer BM disposed on the touch sensing layer TSU, and the color filters CF1 through CF3 of the color filter layer CFL may be disposed on the light blocking layer BM.

The substrate SUB may be a base substrate or a base member. The substrate SUB may be a flexible substrate that can be bent, folded, rolled, etc. For example, the substrate SUB may include polymer resin such as polyimide PI. However, the present disclosure is not limited thereto. As another example, the substrate SUB may include a glass material or a metal material.

The thin-film transistor layer TFTL may include a first buffer layer BF1, bottom metal layers BML, a second buffer layer BF2, thin-film transistors TFT, a gate insulating layer GI, a first interlayer insulating layer ILD1, capacitor electrodes CPE, a second interlayer insulating layer ILD2, first connection electrodes CNE1, a first passivation layer PAS1, second connection electrodes CNE2, and a second passivation layer PAS2.

The first buffer layer BF1 may be disposed on the substrate SUB. The first buffer layer BF1 may include an inorganic layer that can prevent or reduce penetration of air or moisture. For example, the first buffer layer BF1 may include a plurality of inorganic layers stacked alternately.

The bottom metal layers BML may be disposed on the first buffer layer BF1. For example, each of the bottom metal layers BML may be a single layer or a multilayer made of any one or more selected from molybdenum (Mo), aluminum (Al), chromium (Cr), gold (Au), titanium (Ti), nickel (Ni), neodymium (Nd), copper (Cu), and alloys thereof.

The second buffer layer BF2 may cover the first buffer layer BF1 and the bottom metal layers BML. The second buffer layer BF2 may include an inorganic layer that can prevent or reduce penetration of air or moisture. For example, the second buffer layer BF2 may include a plurality of inorganic layers stacked alternately.

The thin-film transistors TFT may be disposed on the second buffer layer BF2 and may constitute respective pixel circuits of a plurality of pixels. For example, each of the thin-film transistors TFT may be a driving transistor or a switching transistor of a pixel circuit. Each of the thin-film transistors TFT may include a semiconductor layer ACT, a source electrode SE, a drain electrode DE, and a gate electrode GE.

The semiconductor layers ACT may be disposed on the second buffer layer BF2. The semiconductor layers ACT may overlap the bottom metal layers BML and the gate electrodes GE in the thickness direction and may be insulated from the gate electrodes GE by the gate insulating layer GI. Portions of each semiconductor layer ACT may be formed into the source electrode SE and the drain electrode DE by making the material of the semiconductor layer ACT conductive.

The gate electrodes GE may be disposed on the gate insulating layer GI. The gate electrodes GE may overlap the semiconductor layers ACT with the gate insulating layer GI interposed between them.

The gate insulating layer GI may be disposed on the semiconductor layers ACT. For example, the gate insulating layer GI may cover the semiconductor layers ACT and the second buffer layer BF2 and may insulate the semiconductor layers ACT from the gate electrodes GE. The gate insulating layer GI may include contact holes through which the first connection electrodes CNE1 pass.

The first interlayer insulating layer ILD1 may cover the gate electrodes GE and the gate insulating layer GI. The first interlayer insulating layer ILD1 may include contact holes through which the first connection electrodes CNE1 pass. The contact holes of the first interlayer insulating layer ILD1 may be connected to the contact holes of the gate insulating layer GI and contact holes of the second interlayer insulating layer ILD2.

The capacitor electrodes CPE may be disposed on the first interlayer insulating layer ILD1. The capacitor electrodes CPE may overlap the gate electrodes GE in the thickness direction. The capacitor electrodes CPE and the gate electrodes GE may form capacitances.

The second interlayer insulating layer ILD2 may cover the capacitor electrodes CPE and the first interlayer insulating layer ILD1. The second interlayer insulating layer ILD2 may include the contact holes through which the first connection electrodes CNE1 pass. The contact holes of the second interlayer insulating layer ILD2 may be connected to the contact holes of the first interlayer insulating layer ILD1 and the contact holes of the gate insulating layer GI.

The first connection electrodes CNE1 may be disposed on the second interlayer insulating layer ILD2. The first connection electrodes CNE1 may electrically connect the drain electrodes DE of the thin-film transistors TFT to the second connection electrodes CNE2. The first connection electrodes CNE1 may be inserted into the contact holes formed in the second interlayer insulating layer ILD2, the first interlayer insulating layer ILD1 and the gate insulating layer GI to contact the drain electrodes DE of the thin-film transistors TFT.

The first passivation layer PAS1 may cover the first connection electrodes CNE1 and the second interlayer insulating layer ILD2. The first passivation layer PAS1 may protect the thin-film transistors TFT. The first passivation layer PAS1 may include contact holes through which the second connection electrodes CNE2 pass.

The second connection electrodes CNE2 may be disposed on the first passivation layer PAS1. The second connection electrodes CNE2 may electrically connect the first connection electrodes CNE1 to pixel electrodes AE of light emitting elements ED. The second connection electrodes CNE2 may be inserted into the contact holes formed in the first passivation layer PAS1 to contact the first connection electrodes CNE1.

The second passivation layer PAS2 may cover the second connection electrodes CNE2 and the first passivation layer PAS1. The second passivation layer PAS2 may include contact holes through which the pixel electrodes AE of the light emitting elements ED pass.

The light emitting element layer EML may be disposed on the thin-film transistor layer TFTL. The light emitting element layer EML may include the light emitting elements ED and the pixel defining layer PDL. Each of the light emitting elements ED may include the pixel electrode AE, a light emitting layer EL, and a common electrode CE.

The pixel electrodes AE may be disposed on the second passivation layer PAS2. Each of the pixel electrodes AE may overlap any one of the openings OPE1 through OPE3 of the pixel defining layer PDL. The pixel electrodes AE may be electrically connected to the drain electrodes DE of the thin-film transistors TFT through the first and second connection electrodes CNE1 and CNE2.

The light emitting layers EL may be disposed on the pixel electrodes AE. For example, the light emitting layers EL may be, but are not limited to, organic light emitting layers made of an organic material. When each of the light emitting layers EL is an organic light emitting layer, when a thin-film transistor TFT applies a set or predetermined voltage to the pixel electrode AE of a light emitting element ED and when the common electrode CE of the light emitting element ED receives a common voltage or a cathode voltage, holes and electrons may move to the light emitting layer EL through a hole transporting layer and an electron transporting layer, respectively, and may combine together in the light emitting layer EL to emit light.

The common electrode CE may be disposed on the light emitting layers EL. For example, the common electrode CE may be implemented as an electrode common to all pixels without being separated for a plurality of pixels. The common electrode CE may be disposed on the light emitting layers EL in the first through third emission areas EA1 through EA3 and may be disposed on the pixel defining layer PDL in an area excluding the first through third emission areas EA1 through EA3.

The common electrode CE may receive a common voltage or a low-potential voltage. When the pixel electrodes AE receive voltages corresponding to data voltages and the common electrode CE receives a low-potential voltage, a potential difference may be formed between the pixel electrodes AE and the common electrode CE so that the light emitting layers EL can emit light.

The pixel defining layer PDL may include a plurality of openings OPE1 through OPE3 and may be disposed on the second passivation layer PAS2 and a portion of each pixel electrode AE. The pixel defining layer PDL may include a first opening OPE1, a second opening OPE2 and a third opening OPE3, and each of the openings OPE1 through OPE3 may expose a portion of a pixel electrode AE. As described above, the openings OPE1 through OPE3 of the pixel defining layer PDL may respectively define the first through third emission areas EA1 through EA3 and may have different areas or sizes. The pixel defining layer PDL may separate and insulate the respective pixel electrodes AE of the light emitting elements ED from each other. The pixel defining layer PDL may include a light absorbing material to prevent or reduce reflection of light. For example, the pixel defining layer PDL may include a polyimide (PI)-based binder and a pigment in which red, green, and blue are mixed. In one or more embodiments, the pixel defining layer PDL may include a cardo-based binder resin and a mixture of a lactam black pigment and a blue pigment. In one or more embodiments, the pixel defining layer PDL may include carbon black.

The encapsulation layer TFEL may be disposed on the common electrode CE to cover the light emitting elements ED. The encapsulation layer TFEL may include at least one inorganic layer to prevent or substantially prevent oxygen or moisture from penetrating into the light emitting element layer EML. The encapsulation layer TFEL may include at least one organic layer to protect the light emitting element layer EML from foreign substances such as dust.

In one or more embodiments, the encapsulation layer TFEL may include a first encapsulation layer TFE1, a second encapsulation layer TFE2, and a third encapsulation layer TFE3. The first encapsulation layer TFE1 and the third encapsulation layer TFE3 may be inorganic encapsulation layers, and the second encapsulation layer TFE2 disposed between them may be an organic encapsulation layer.

Each of the first encapsulation layer TFE1 and the third encapsulation layer TFE3 may include one or more inorganic insulating materials. The inorganic insulating materials may include aluminum oxide, titanium oxide, tantalum oxide, hafnium oxide, zinc oxide, silicon oxide, silicon nitride, and/or silicon oxynitride.

The second encapsulation layer TFE2 may include a polymer-based material. The polymer-based material may include acrylic resin, epoxy resin, polyimide, polyethylene, etc. For example, the second encapsulation layer TFE2 may include acrylic resin such as polymethyl methacrylate or polyacrylic acid. The second encapsulation layer TFE2 may be formed by curing a monomer or applying a polymer.

The touch sensing layer TSU may be disposed on the encapsulation layer TFEL. The touch sensing layer TSU may include a first touch insulating layer SIL1, a second touch insulating layer SIL2, the touch electrode TL, and a third touch insulating layer SIL3.

The first touch insulating layer SIL1 may be disposed on the encapsulation layer TFEL. The first touch insulating layer SIL1 may have insulating and optical functions. The first touch insulating layer SIL1 may include at least one inorganic layer. Optionally, the first touch insulating layer SIL1 may not be provided.

The second touch insulating layer SIL2 may cover the first touch insulating layer SIL1. A touch electrode of another layer may be further disposed on the first touch insulating layer SIL1, and the second touch insulating layer SIL2 may cover the touch electrode TL. The second touch insulating layer SIL2 may have insulating and optical functions. For example, the second touch insulating layer SIL2 may be an inorganic layer including at least one of a silicon nitride layer, a silicon oxynitride layer, a silicon oxide layer, a titanium oxide layer, and/or an aluminum oxide layer.

Portions of the touch electrode TL may be disposed on the second touch insulating layer SIL2. The touch electrode TL may not overlap the first through third emission areas EA1 through EA3. The touch electrode TL may be a single layer of molybdenum (Mo), titanium (Ti), copper (Cu), aluminum (Al) or indium tin oxide (ITO) or may be a stacked structure (Ti/Al/Ti) of aluminum and titanium, a stacked structure (ITO/Al/ITO) of aluminum and indium tin oxide, an APC alloy, or a stacked structure (ITO/APC/ITO) of an APC alloy and indium tin oxide.

The third touch insulating layer SIL3 may cover the touch electrode TL and the second touch insulating layer SIL2. The third touch insulating layer SIL3 may have insulating and optical functions. The third touch insulating layer SIL3 may be made of at least one of the example materials of the second touch insulating layer SIL2.

The light blocking layer BM may be disposed on the third touch insulating layer SIL3 of the touch sensing layer TSU. The light blocking layer BM may cover conductive lines of the touch electrode TL and may include a plurality of holes OPT1 through OPT3 overlapping the emission areas EA1 through EA3. For example, a first hole OPT1 may overlap the first emission area EA1 or the first opening OPE1. A second hole OPT2 may overlap the second emission area EA2 or the second opening OPE2, and a third hole OPT3 may overlap the third emission area EA3 or the third opening OPE3. The areas or sizes of the holes OPT1 through OPT3 may be larger than the areas or sizes of the openings OPE1 through OPE3 of the pixel defining layer PDL, respectively. Because the holes OPT1 through OPT3 of the light blocking layer BM are formed to be larger than the openings OPE1 through OPE3 of the pixel defining layer PDL, light emitted from the emission areas EA1 through EA3 can be seen by a user not only from the front but also from the side of the display device 10.

The light blocking layer BM may include a light absorbing material. For example, the light blocking layer BM may include an inorganic black pigment or an organic black pigment. The inorganic black pigment may be carbon black, and the organic black pigment may include at least one of lactam black, perylene black, and aniline black. However, the present disclosure is not limited thereto. The light blocking layer BM may prevent or reduce color mixing by preventing or reducing intrusion of visible light between the first through third emission areas EA1 through EA3, thereby improving a color gamut of the display device 10.

The color filters CF1 through CF3 of the color filter layer CFL may be disposed on the light blocking layer BM. Different color filters CF1 through CF3 may be disposed to correspond to different emission areas EA1 through EA3 or openings OPE1 through OPE3 and different holes OPT1 through OPT3 of the light blocking layer BM, respectively. For example, a first color filter CF1 may be disposed to correspond to the first emission area EA1, a second color filter CF2 may be disposed to correspond to the second emission area EA2, and a third color filter CF3 may be disposed to correspond to the third emission area EA3. The first color filter CF1 may be disposed in the first hole OPT1 of the light blocking layer BM, the second color filter CF2 may be disposed in the second hole OPT2 of the light blocking layer BM, and the third color filter CF3 may be disposed in the third hole OPT3 of the light blocking layer BM. The color filters CF1 through CF3 may respectively have a larger area than the holes OPT1 through OPT3 of the light blocking layer BM in a plan view, and a portion of each of the color filters CF1 through CF3 may be directly disposed on the light blocking layer BM.

A planarization layer OC may be disposed on the color filters CF1 through CF3 to planarize upper ends of the color filters CF1 through CF3. The planarization layer OC may be a colorless light-transmitting layer that does not have a color in a visible light band. For example, the planarization layer OC may include a colorless light-transmitting organic material such as acrylic resin.

According to one or more embodiments, each of the color filters CF1 through CF3 of the display device 10 may overlap other adjacent color filters CF1 through CF3 on the light blocking layer BM. The color filters CF1 through CF3 on the light blocking layer BM may be disposed such that two color filters CF1 through CF3 adjacent to each other completely cover the light blocking layer BM. The two adjacent color filters CF1 through CF3 may partially overlap each other on the light blocking layer BM. The overlap of the color filters CF1 through CF3 can reduce the reflection of external light by the light blocking layer BM, and the overlapping arrangement of the color filters CF1 through CF3 can be designed to further reduce the reflection of the external light.

Figure 11:
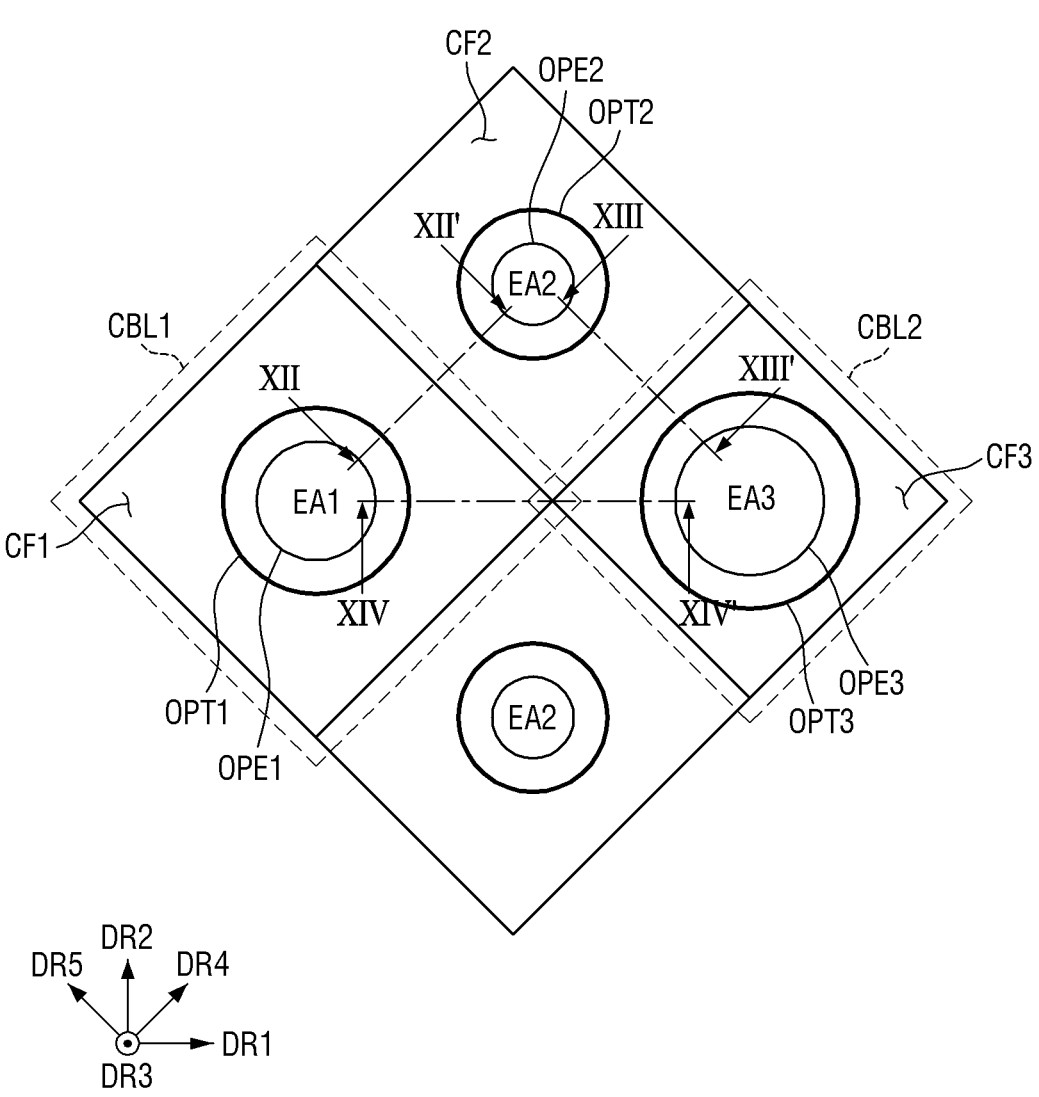
FIG. 11 is a plan view illustrating, in more detail, the arrangement of the color filters in the first display area of the display device according to one or more embodiments of the present disclosure.
Figure 12:
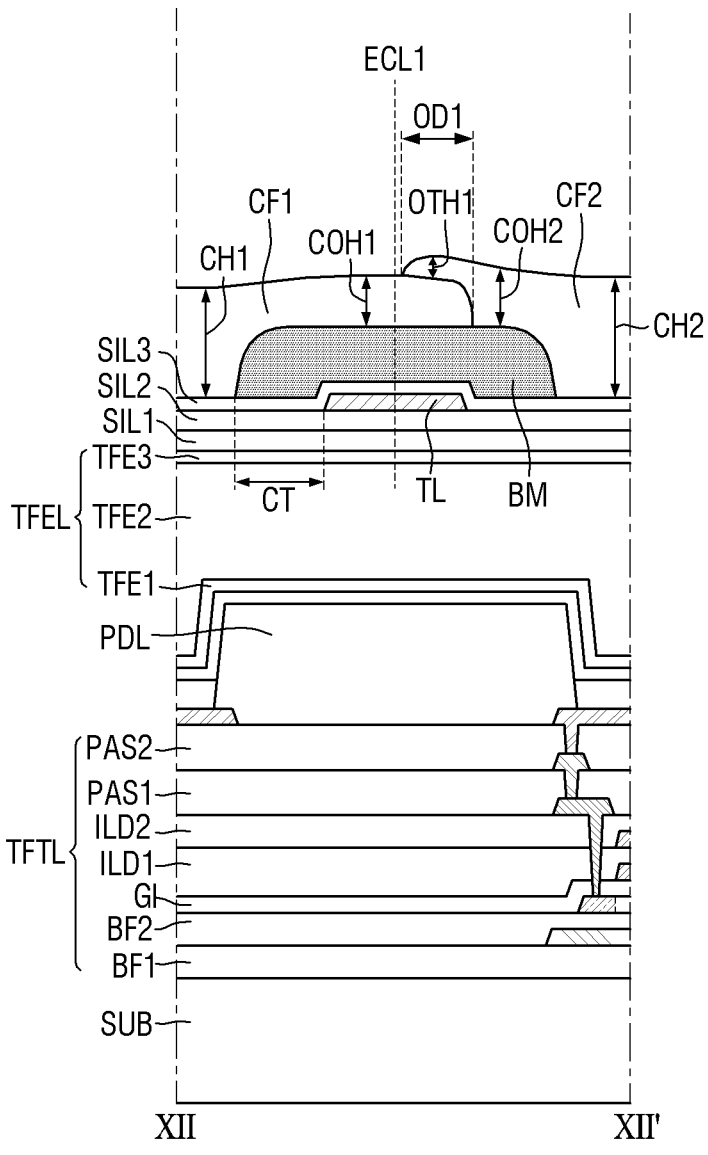
FIG. 12 is a cross-sectional view taken along line XII-XII' of FIG. 11, according to one or more embodiments of the present disclosure.
Figure 13:
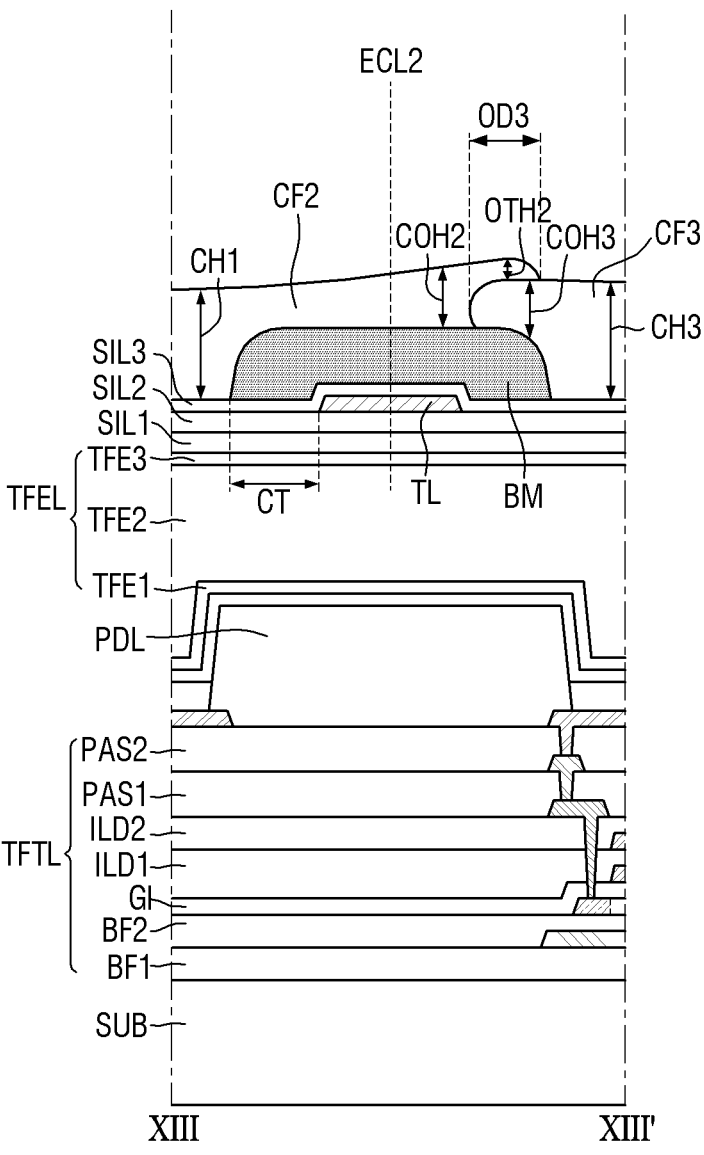
FIG. 13 is a cross-sectional view taken along line XIII-XIII' of FIG. 11, according to one or more embodiments of the present disclosure.
Figure 14:
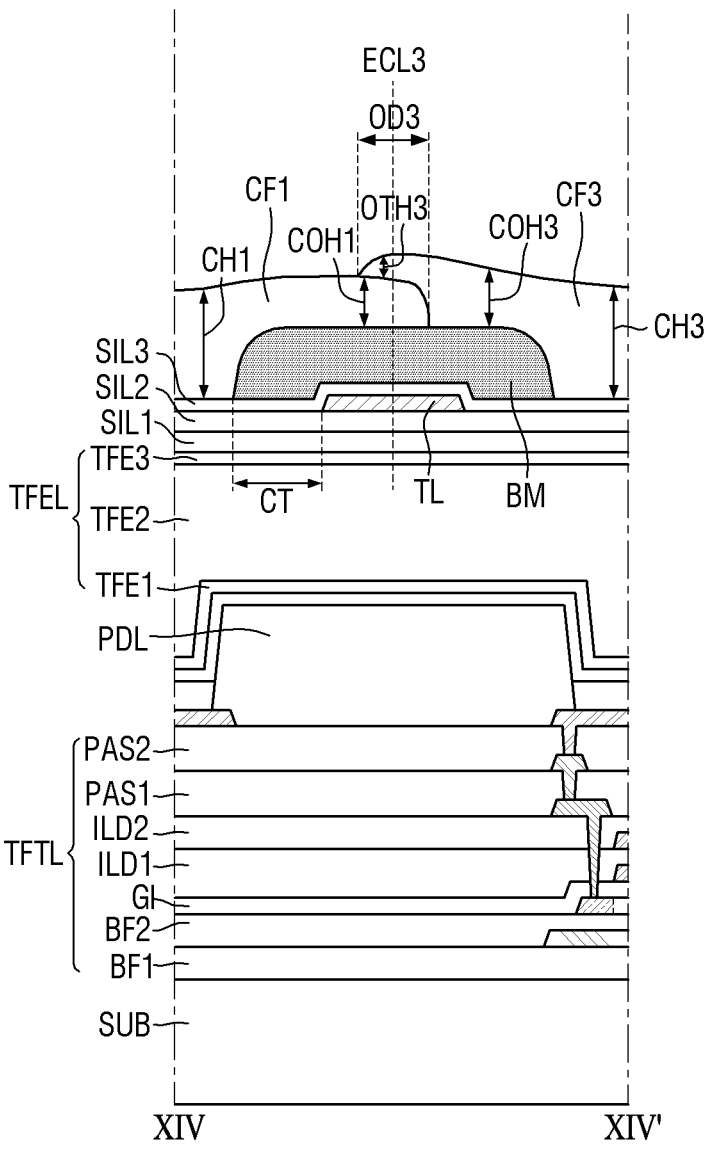
FIG. 14 is a cross-sectional view taken along line XIV-XIV' of FIG. 11, according to one or more embodiments of the present disclosure.

FIG. 11 is a plan view illustrating, in more detail, the arrangement of the color filters CF1 through CF3 in the first display area DA1 of the display device 10 of FIG. 6, according to one or more embodiments of the present disclosure. FIG. 12 is a cross-sectional view taken along line XII-XII' of FIG. 11, according to one or more embodiments of the present disclosure. FIG. 13 is a cross-sectional view taken along line XIII-XIII' of FIG. 11, according to one or more embodiments of the present disclosure. FIG. 14 is a cross-sectional view taken along line XIV-XIV' of FIG. 11, according to one or more embodiments of the present disclosure.

FIG. 11 is a plan view illustrating edges (CBL1 and CBL2) of a first color filter CF1 and a third color filter CF3, respectively, in the planar arrangement of the first color filter CF1, second color filters CF2, and the third color filter CF3 adjacent to each other. FIGS. 12 through 14 illustrate cross sections across portions where the first color filter CF1, a second color filter CF2, and the third color filter CF3 overlap each other.

Referring to FIGS. 11 through 14 in addition to FIGS. 8 through 10, in the display device 10, the first color filter CF1 and a second color filter CF2 adjacent to each other may overlap each other on the light blocking layer BM, and the second color filter CF2 and the third color filter CF3 may overlap each other on the light blocking layer BM. The first color filter CF1 and the third color filter CF3 adjacent to each other may also overlap each other on the light blocking layer BM.

According to one or more embodiments, in the display device 10, the second color filter CF2 which is a green color filter may be disposed on the first color filter CF1 which is a red color filter and the third color filter CF3 which is a blue color filter. The third color filter CF3 which is a blue color filter may be disposed on the first color filter CF1 which is a red color filter. In a manufacturing process of the display device 10, the color filters CF1 through CF3 may be formed by a photoresist process. The color filters CF1 through CF3 may be formed in the order of the first color filter CF1, the third color filter CF3, and the second color filter CF2.

While FIG. 9 illustrates the arrangement of the color filters CF1 through CF3 as viewed from above, FIG. 11 illustrates boundary lines CBL1 and CBL2 of the first color filter CF1 and the third color filter CF3, respectively, disposed under the second color filter CF2, in addition to the arrangement of the color filters CF1 through CF3 as viewed from above. A first boundary line CBL1 of the first color filter CF1 may overlap the second color filter CF2 and may be located under the second color filter CF2. A second boundary line CBL2 of the third color filter CF3 may also overlap the second color filter CF2 and may be located under the second color filter CF2. A portion of the first boundary line CBL1 of the first color filter CF1 which overlaps the third color filter CF3 may be located under the third color filter CF3. In the plan view of FIG. 11, because the second color filter CF2 is disposed on the other color filters, a boundary line of the second color filter CF2 is exposed. On the other hand, because the first color filter CF1 and the third color filter CF3 are disposed under the second color filter CF2, the boundary lines CBL1 and CBL2 of the first color filter CF1 and the third color filter CF3 are not exposed.

Although the light blocking layer BM may include a light absorbing material, some of the light incident from the outside may be reflected by the light blocking layer BM. The color filters CF1 through CF3 disposed in the holes OPT1 through OPT3 of the light blocking layer BM may be partially directly disposed on the light blocking layer BM and may completely cover the light blocking layer BM. Because two different color filters CF1 through CF3 adjacent to each other include different colorants and overlap each other on the light blocking layer BM, the reflection of external light by the light blocking layer BM can be reduced. However, transmittances of the color filters CF1 through CF3 may vary according to materials that form the color filters CF1 through CF3, and the reflection of external light can be more effectively reduced depending on the overlapping order of the color filters CF1 through CF3.

In one or more embodiments, the transmittance of the second color filter CF2 which is a green color filter may be lower than the transmittances of the first color filter CF1 and the third color filter CF3, and the second color filter CF2 may be disposed on other color filters (e.g., the first color filter CF1 and the third color filter CF3) on the light blocking layer BM. The transmittance of the third color filter CF3 which is a blue color filter may be lower than the transmittance of the first color filter CF1 which is a red color filter, and the third color filter CF3 may be disposed on the first color filter CF1. When a color filter CF1, CF2 or CF3 having a relatively low transmittance is disposed on another color filter CF1, CF2 or CF3, the scattered reflection of light by the light blocking layer BM may be reduced in a portion where the different color filters CF1 through CF3 overlap. Accordingly, light reflected by the light blocking layer BM can be prevented or substantially prevented from being emitted to the outside, and the display device 10 can reduce the reflection of external light occurring in areas other than the emission areas EA1 through EA3.

Reflection of external light by the display device 10 may include reflection in the emission areas EA1 through EA3, reflection in transmission areas formed by the holes OPT1 through OPT3 of the light blocking layer BM, and reflection in the light blocking layer BM. The reflection of external light in the emission areas EA1 through EA3 and the transmission areas may be controlled or selected by adjusting the sizes of the openings OPE1 through OPE3 of the pixel defining layer PDL, the sizes of the holes OPT1 through OPT3 of the light blocking layer BM, and distances between the openings OPE1 through OPE3 and the holes OPT1 through OPT3. However, controlling the above conditions may affect factors related to the light efficiency of the display device 10 such as the efficiency and life of the light emitting elements ED and the side visibility of the display device 10 and may affect performance such as the touch sensitivity of the touch sensing layer TSU.

In contrast, when the color filters CF1 through CF3 are placed to overlap each other on the light blocking layer BM, the reflection of external light by the light blocking layer BM can be greatly reduced without affecting the light efficiency of the display device 10. In one or more embodiments, the color of reflected light can be controlled or selected to a color comfortable to a user by adjusting the areas and thicknesses of the color filters CF1 through CF3 and the widths of overlapping portions of the different color filters CF1 through CF3 in a plan view. For example, the color of reflected light in the emission areas EA1 through EA3 and the transmission areas as reflected light due to external light may be controlled or selected according to the areas of the color filters CF1 through CF3, and reflected light in the light blocking layer BM may vary according to the areas or widths of the overlapping portions of the color filters CF1 through CF3.

According to one or more embodiments, the areas of the color filters CF1 through CF3 in a plan view may be different from each other. For example, the area of the first color filter CF1 which is a red color filter may be larger than the area of the second color filter CF2 which is a green color filter and the area of the third color filter CF3 which is a blue color filter. In one or more embodiments, the area of the third color filter CF3 may be larger than the area of the second color filter CF2. As illustrated in FIGS. 9 and 11, each of the color filters CF1 through CF3 may be shaped like a quadrilateral, a rectangle, or a rhombus including sides extending in the fourth direction DR4 and the fifth direction DR5. The sides of each of the first color filter CF1 and the third color filter CF3 which extend in the fourth direction DR4 and the fifth direction DR5 may have the same length and form a square or rhombus shape in a plan view. The area of the first color filter CF1 may be larger than the area of the third color filter CF3 in a plan view. In the case of the second color filter CF2 adjacent to the first color filter CF1 and the third color filter CF3, the sides extending in the fourth direction DR4 and the fifth direction DR5 may have different lengths and form a rectangular shape in a plan view.

In other words, because the sides of each of the first color filter CF1 and the third color filter CF3 have the same length, the first color filter CF1 and the third color filter CF3 may have a shape irrelevant to position. However, because the sides of the second color filter CF2 have different lengths, a direction in which long sides of the second color filter CF2 extend may vary according to position. Referring to the shapes of the second color filters CF2 illustrated in FIG. 9, the second color filter CF2 disposed in the second row R2 and the second column C2 may have long sides extending in the fourth direction DR4, and the second color filter CF2 disposed in the second row R2 and the fourth column C4 may have long sides extending in the fifth direction DR5. In the display device 10 according to one or more embodiments, the planar shapes and areas of the color filters CF1 through CF3 may be designed to allow external light of the display device 10 to have a specific color.

In one or more embodiments, a planar area ratio of the first color filter CF1 to the second color filter CF2 may be in the range of about 1:0.3 to 1:0.7, and an area ratio of the first color filter CF1 to the third color filter CF3 may be in the range of about 1:0.4 to about 1:1. For example, an area ratio of the first color filter CF1, the second color filter CF2, and the third color filter CF3 may be 1:0.59:0.52 or 1:0.59:1. In the embodiment(s) of FIGS. 9 and 11, the area ratio of the first color filter CF1, the second color filter CF2, and the third color filter CF3 may be 1:0.59:0.52. However, the area ratio of the color filters CF1 through CF3 is not limited to the above example, and the planar areas of the color filters CF1 through CF3 may be designed differently so that the color of reflected light in the display device 10 and the electronic device 1 has desired or suitable color coordinates.

When the areas of the color filters CF1 through CF3 in a plan view are designed to have a specific ratio, the thicknesses and widths of the overlapping portions of the color filters CF1 through CF3 on the light blocking layer BM may also be suitably designed. For example, in an overlapping portion of the first color filter CF1 and the second color filter CF2 illustrated in FIG. 12, a maximum thickness CH1 of the first color filter CF1 may be greater than a thickness COH1 of a portion of the first filter CF1 which is disposed on the light blocking layer BM. A maximum thickness CH2 of the second color filter CF2 may be greater than a thickness COH2 of a portion of the second color filter CF2 which is disposed on the light blocking layer BM. A thickness OTH1 of a portion of the second color filter CF2 which is disposed on the first color filter CF1 on the light blocking layer BM may be smaller than the maximum thicknesses CH1 and CH2 of the first color filter CF1 and the second color filter CF2 and the thicknesses COH1 and COH2 of the portions of the first color filter CF1 and the second color filter CF2 which are disposed on the light blocking layer BM.

An overlapping portion of the second color filter CF2 and the third color filter CF3 illustrated in FIG. 13 is similar to the overlapping portion described above with reference to FIG. 12. A maximum thickness CH3 of the third color filter CF3 may be greater than a thickness COH3 of a portion of the third color filter CF3 which is disposed on the light blocking layer BM. A thickness OTH2 of a portion of the second color filter CF2 which is disposed on the third color filter CF3 on the light blocking layer BM may be smaller than the maximum thicknesses CH2 and CH3 of the second color filter CF2 and the third color filter CF3 and the thicknesses COH2 and COH3 of the portions of the second color filter CF2 and the third color filter CF3 which are disposed on the light blocking layer BM.

An overlapping portion of the third color filter CF3 and the first color filter CF1 illustrated in FIG. 14 is similar to the overlapping portions described above with reference to FIGS. 12 and 13. A thickness OTH3 of a portion of the third color filter CF3 which is disposed on the first color filter CF1 on the light blocking layer BM may be smaller than the maximum thicknesses CH3 and CH1 of the third color filter CF3 and the first color filter CF1 and the thicknesses COH3 and COH1 of the portions of the third color filter CF3 and the first color filter CF1 which are disposed on the light blocking layer BM.

In one or more embodiments, the maximum thicknesses CH1 through CH3 of the color filters CF1 through CF3 may be in the range of 2 to 4 µm, and the thickness OTH1 or OTH2 of the portion of the second color filter CF2 which is disposed on the first color filter CF1 or the third color filter CF3, respectively, and the thickness OTH3 of the portion of the third color filter CF3 which is disposed on first color filter CF1 may be in the range of 0.5 to 1.5 µm. The thickness OTH1, OTH2 or OTH3 of a portion of each of the color filters CF1 through CF3 which is disposed on another color filter may be in the range of 12.5 to 75% of the maximum thickness of the color filter CF1, CF2 or CF3.

In one or more embodiments, widths OD1 through OD3 of the overlapping portions of the color filters CF1 through CF3 may be greater than the thicknesses OTH1 through OTH3 of the portions of the color filters CF1 through CF3 which are disposed on other color filters. For example, a width OD1 of a portion of the second color filter CF2 which is disposed on the first color filter CF1, a width OD2 of a portion of the second color filter CF2 which is disposed on the third color filter CF3, and a width OD3 of a portion of the third color filter CF3 which is disposed on the first color filter CF1 may be greater than the thicknesses OTH1 through OTH3 of the portions of the second color filter CF2 and the third color filter CF3 which are disposed on other color filters. The widths OD1 through OD3 of the overlapping portions of the color filters CF1 through CF3 may be in the range of 1.5 to 2.5 µm and may be in the range of 37.5 to 125% of the maximum thicknesses CH1 through CH3 of the color filters CF1 through CF3. However, the ratios of the widths OD1 through OD3 and the thicknesses OTH1 through OTH3 of the overlapping portions of the color filters CF1 through CF3 to the thicknesses of the color filters CF1 through CF3 are not limited to the above values and may vary according to the sizes of the color filters CF1 through CF3 in a plan view.

Inclination angles or taper angles of the edges of the color filters CF1 through CF3 may be adjusted in a specific range together with the thicknesses of the color filters CF1 through CF3 and the widths of the overlapping portions of the color filters CF1 through CF3. In one or more embodiments, the inclination angles of the edges of the first through third color filters CF1 through CF3 may be in the range of 40 to 110 degrees. In one or more embodiments, the inclination angle of a portion of each of the second color filter CF2 and the third color filter CF3 which is disposed on another color filter may be in the range of 60 to 70 degrees.

Like the widths and thicknesses of the overlapping portions of the color filters CF1 through CF3 adjacent to each other, positions of the overlapping portions of the color filters CF1 through CF3 may vary according to the areas of the color filters CF1 through CF3. An imaginary center line ECL1, ECL2 or ECL3 may be defined based on the width of the light blocking layer BM in a portion disposed between two adjacent holes OPT1 through OPT3 of the light blocking layer BM, and an overlapping portion of different color filters CF1 through CF3 may be located to one side from the imaginary center line ECL1, ECL2 or ECL3. As illustrated in FIG. 12, the overlapping portion of the second color filter CF2 and the first color filter CF1 may be disposed adjacent to the second color filter CF2 or the second emission area EA2 based on a first imaginary center line ECL1. As illustrated in FIG. 13, the overlapping portion of the second color filter CF2 and the third color filter CF3 may be disposed adjacent to the third color filter CF3 or the third emission area EA3 based on a second imaginary center line ECL2. In contrast, the overlapping portion of the third color filter CF3 and the first color filter CF1 may substantially overlap a third imaginary center line ECL3, as shown, e.g., in FIG. 14.

The arrangement of the color filters CF1 through CF3 may be designed in consideration of the areas of the color filters CF1 through CF3 so that the second color filter CF2 having a relatively low transmittance is located on other color filters. For example, the boundary line CBL1 of the first color filter CF1 may be positioned relatively adjacent to the second emission area EA2, and the second color filter CF2 may be disposed adjacent to the third emission area EA3 by that much, so that the second color filter CF2 having a smaller area than other color filters in a plan view can be disposed on the first color filter CF1 and the third color filter CF3. However, the present disclosure is not limited thereto. In order to further reduce the reflection of external light by the light blocking layer BM, the positions of the boundary lines of the second color filter CF2 and the third color filter CF3 may be designed differently. In this case, the widths of the overlapping portions of the color filters CF1 through CF3 may also be changed. This will be described with reference to one or more embodiments.

In the display device 10 according to one or more embodiments, the second color filter CF2 which is a green color filter having a relatively low transmittance may be located on other color filters, and adjacent color filters CF1 through CF3 may overlap each other while completely covering the light blocking layer BM. In the display device 10, because the color filters CF1 through CF3 overlap each other on the light blocking layer BM as an area other than the emission areas EA1 through EA3 and the transmission areas, it is possible to effectively reduce reflected light due to external light without affecting the light efficiency and life of the light emitting elements ED.

Figure 15:
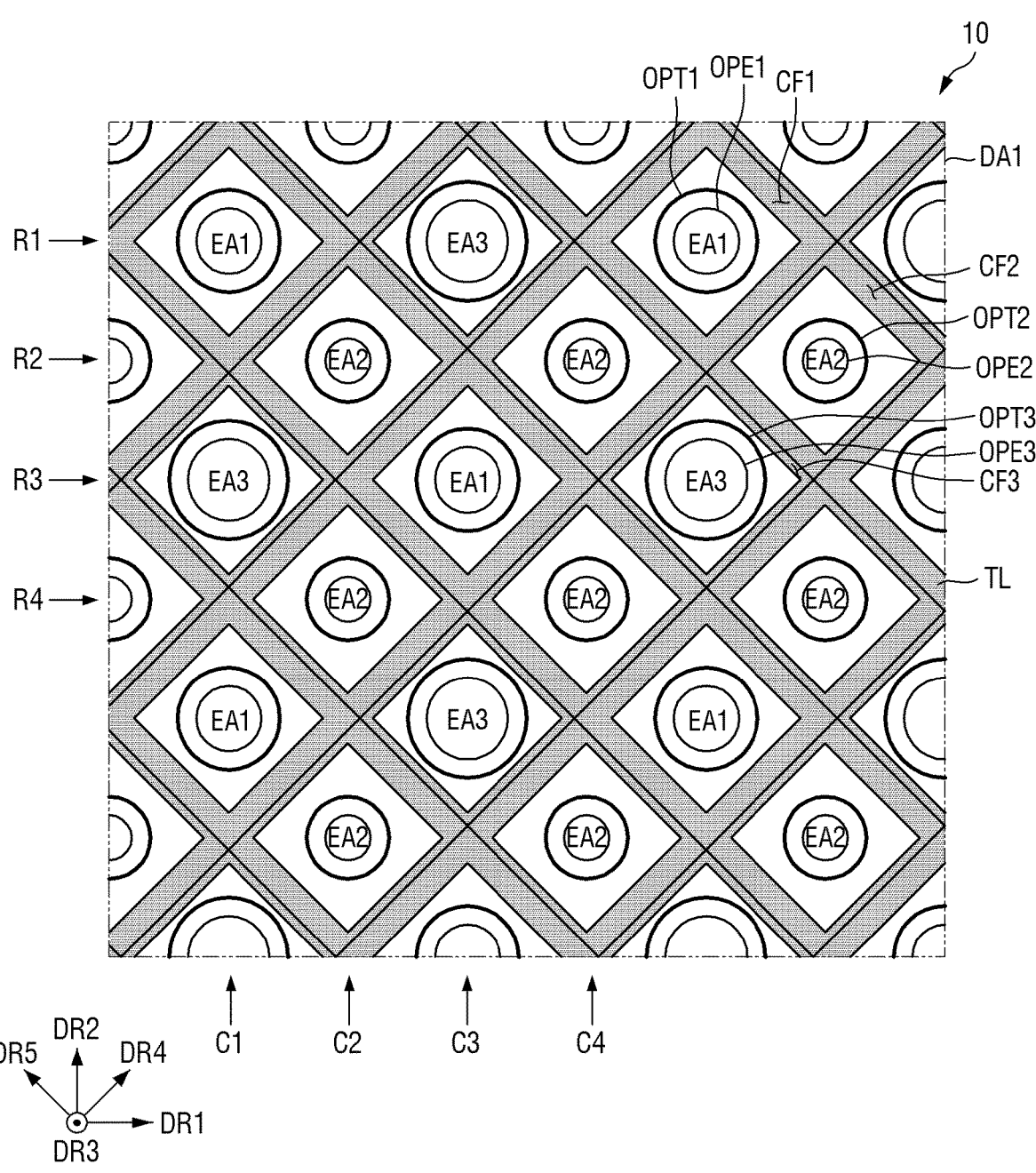
FIG. 15 is a plan view illustrating the relative arrangement of the color filters and a touch electrode in the first display area of the display device according to one or more embodiments of the present disclosure.
Figure 16:
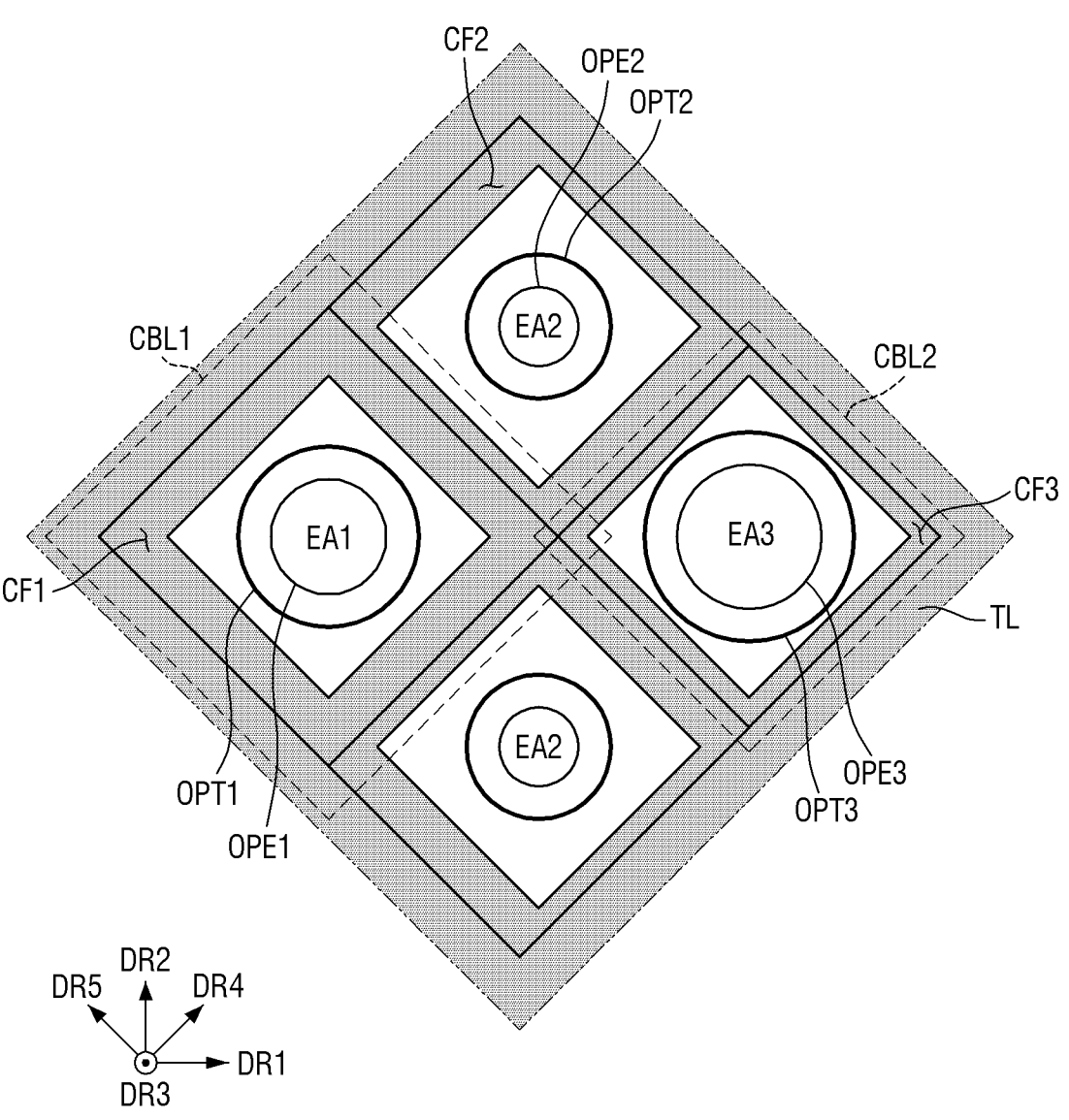
FIG. 16 is a plan view illustrating the arrangement of the color filters of FIG. 15 in more detail, according to one or more embodiments of the present disclosure.

FIG. 15 is a plan view illustrating the relative arrangement of the color filters CF1 through CF3 and the touch electrode TL in the first display area DA1 of the display device 10 of FIG. 6, according to one or more embodiments of the present disclosure. FIG. 16 is a plan view illustrating the arrangement of the color filters CF1 through CF3 of FIG. 15 in more detail, according to one or more embodiments of the present disclosure.

Referring to FIGS. 15 and 16, the touch electrode TL of the touch sensing layer TSU may overlap the light blocking layer BM and may be disposed in the center between two adjacent holes OPT1 through OPT3. The boundaries of the color filters CF1 through CF3 and an overlapping portion of adjacent color filters CF1 through CF3 may be located to one side rather than in the center between the holes OPT1 through OPT3.

For example, the touch electrode TL of the touch sensing layer TSU may have a set or predetermined line width and may overlap the light blocking layer BM. The light blocking layer BM may have a width sufficient to completely cover the touch electrode TL, and a distance CT (as shown, e.g., in FIG. 14) between each edge of the light blocking layer BM and the touch electrode TL may be defined. In one or more embodiments, the line width of the touch electrode TL may be in the range of 4 to 6 μm, and the distance CT between the touch electrode TL and each edge of the light blocking layer BM may be in the range of 5 to 7 μm. A center of the touch electrode TL may substantially overlap a center of the light blocking layer BM, and the distance CT from both (e.g., simultaneously) sides of the touch electrode TL to the edges of the light blocking layer BM may be substantially constant (e.g., substantially the same).

As described above, the overlapping portions of the color filters CF1 through CF3 and the boundary lines of the color filters CF1 through CF3 are disposed to one side from the imaginary center lines ECL1 through ECL3 of the light blocking layer BM. Accordingly, the overlapping portions of the color filters CF1 through CF3 and the boundary lines of the color filters CF1 through CF3 may also be disposed to one side from the center of the touch electrode TL in a line width direction. For example, in a portion where the first color filter CF1 and the second color filter CF2 overlap, an edge of the second color filter CF2 and a portion of the second color filter CF2 which overlaps the first color filter CF1 may be disposed adjacent to the second emission area EA2 based on the touch electrode TL. In a portion where the second color filter CF2 and the third color filter CF3 overlap, an edge of the second color filter CF2 and a portion of the second color filter CF2 which overlaps the third color filter CF3 may be disposed adjacent to the third emission area EA3 based on the touch electrode TL.

Figure 17:
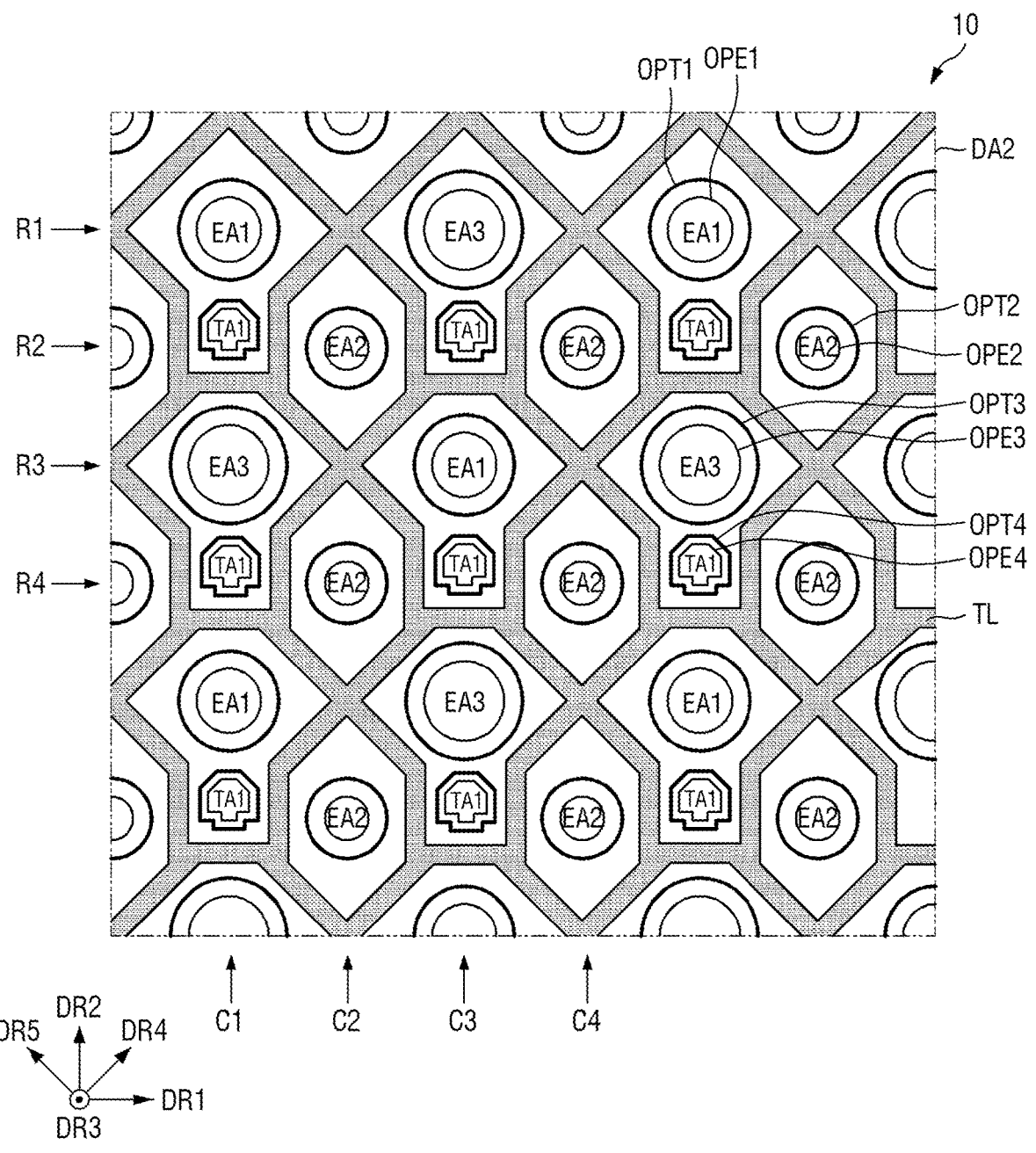
FIG. 17 is a plan view illustrating the arrangement of emission areas in a second display area of the display device according to one or more embodiments of the present disclosure.
Figure 18:
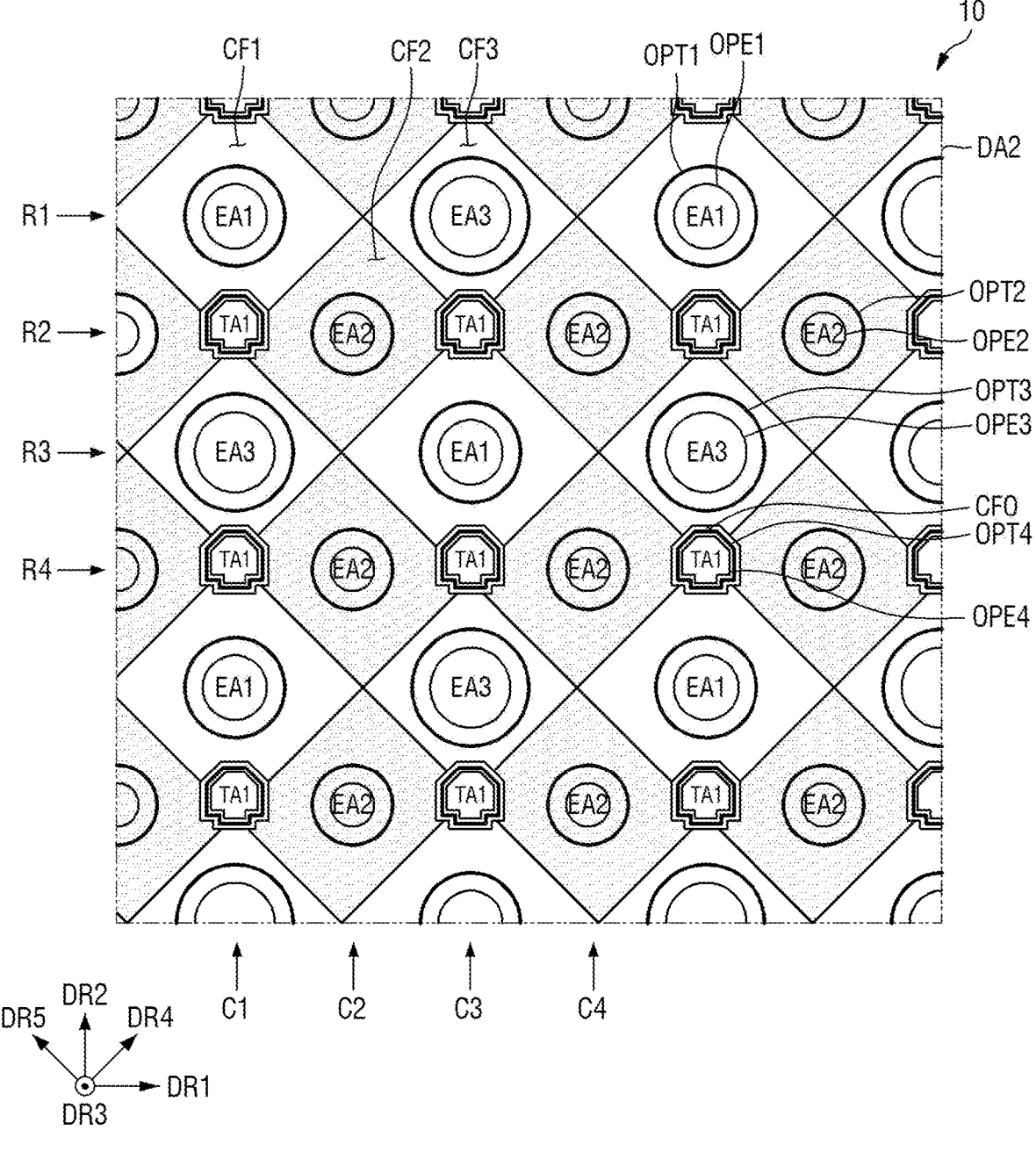
FIG. 18 is a plan view illustrating the arrangement of color filters in the second display area of FIG. 17, according to one or more embodiments of the present disclosure.

FIG. 17 is a plan view illustrating the arrangement of emission areas EA1 through EA3 in the second display area DA2 of the display device 10 of FIG. 6, according to one or more embodiments of the present disclosure. FIG. 18 is a plan view illustrating the arrangement of color filters CF1 through CF3 in the second display area DA2 of FIG. 17, according to one or more embodiments of the present disclosure.

Referring to FIGS. 17 and 18, the display device 10 may include a plurality of emission areas EA1 through EA3 disposed in the second display area DA2 of the display area DA and first transmission areas TA1. Touch electrodes TL, the color filters CF1 through CF3, and the light blocking layer BM may also be disposed in the second display area DA2 and may each independently be the same as those described above.

Each of the first transmission areas TA1 may be disposed between adjacent emission areas EA1 through EA3. For example, each of the first transmission areas TA1 may be disposed between two emission areas adjacent to each other in the first direction DR1 and between two emission areas adjacent to each other in the second direction DR2. The first transmission areas TA1 may be disposed in a first column C1 and a third column C3 in a second row R2 and a fourth row R4. In contrast, the first transmission areas TA1 may not be disposed in a second column C2 and a fourth column C4 in a first row R1 and a third row R3.

The first transmission areas TA1 may be defined by fourth openings OPE4 formed in the pixel defining layer PDL of the light emitting element layer EML. The light blocking layer BM may include fourth holes OPT4 corresponding to and overlapping the first transmission areas TA1, and the color filters CF1 through CF3 may form color filter openings CFO so that the color filters CF1 through CF3 are not disposed in the transmission areas TA1 and the color filter openings CFO may overlap the fourth holes OPT4.

The touch electrode TL may also be disposed in the second display area DA2. The touch electrode TL may generally extend in the fourth direction DR4 and the fifth direction DR5, but portions of the touch electrode TL may extend in the first direction DR1 and the second direction DR2 to bypass the first transmission areas TA1. Portions of the touch electrode TL which extend in the fourth direction DR4 and the fifth direction DR5 may be bent in the second direction DR2 near the first transmission areas TA1 and then may be bent again in the first direction DR1. Accordingly, the touch electrode TL can bypass the first transmission areas TA1.

In the display device 10, the color filters CF1 through CF3 in the second display area DA2 may be disposed to correspond to the emission areas EA1 through EA3, respectively, and may be disposed not to cover each first transmission area TA1 between two adjacent emission areas EA1 through EA3. The first transmission areas TA1 may be defined by the fourth openings OPE4 of the pixel defining layer PDL, the fourth holes OPT4 may be formed in the light blocking layer BM to correspond to the first transmission areas TA1, and the color filters CF1 through CF3 may form the color filter openings CFO. The first transmission areas TA1 may not be covered by the pixel defining layer PDL, the light blocking layer BM and the color filters CF1 through CF3, and the optical device 500 disposed in the second display area DA2 may sense light incident from the outside through the first transmission areas TA1.

Figure 19:
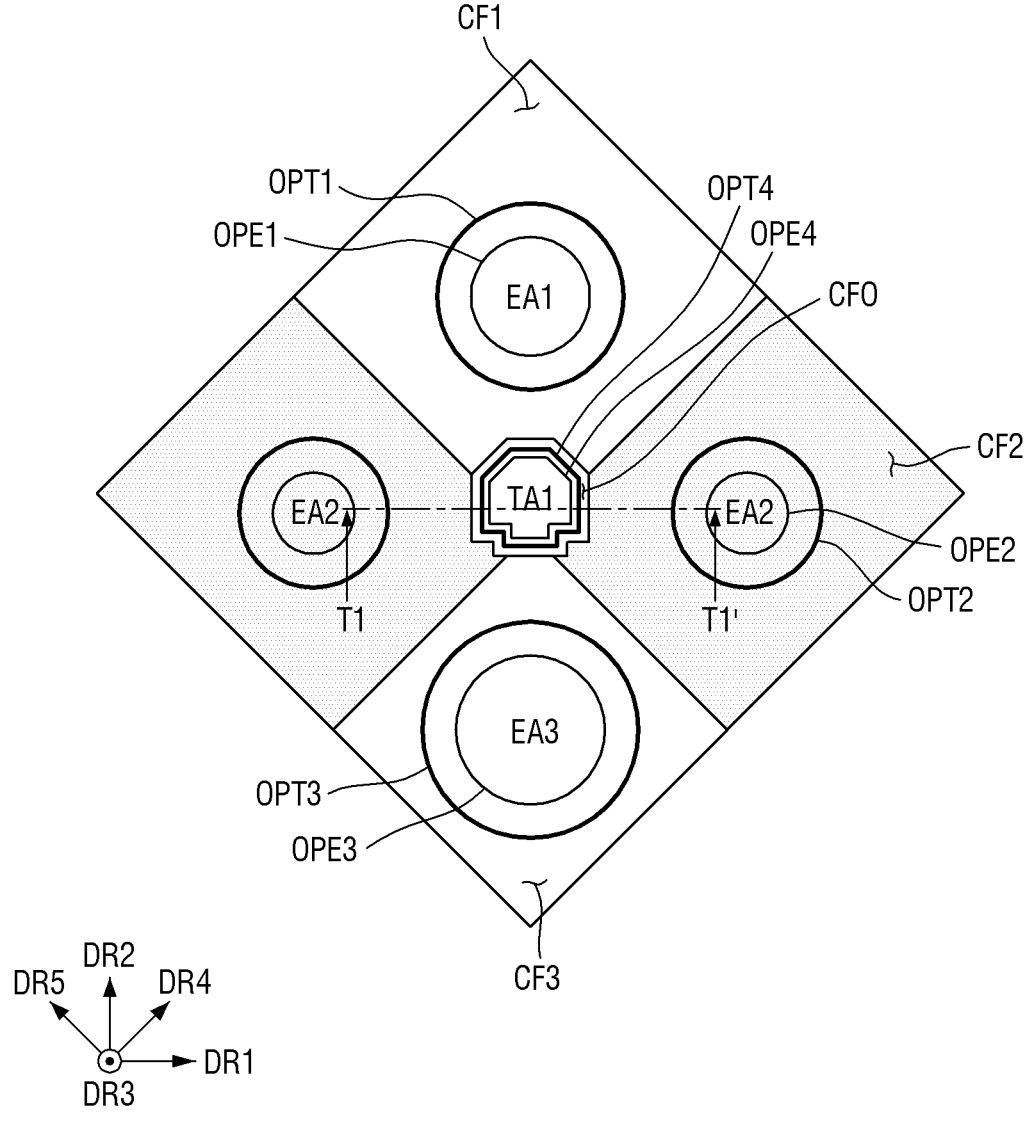
FIG. 19 is a plan view illustrating, in more detail, the arrangement of the color filters in the second display area of the display device according to one or more embodiments of the present disclosure.
Figure 20:
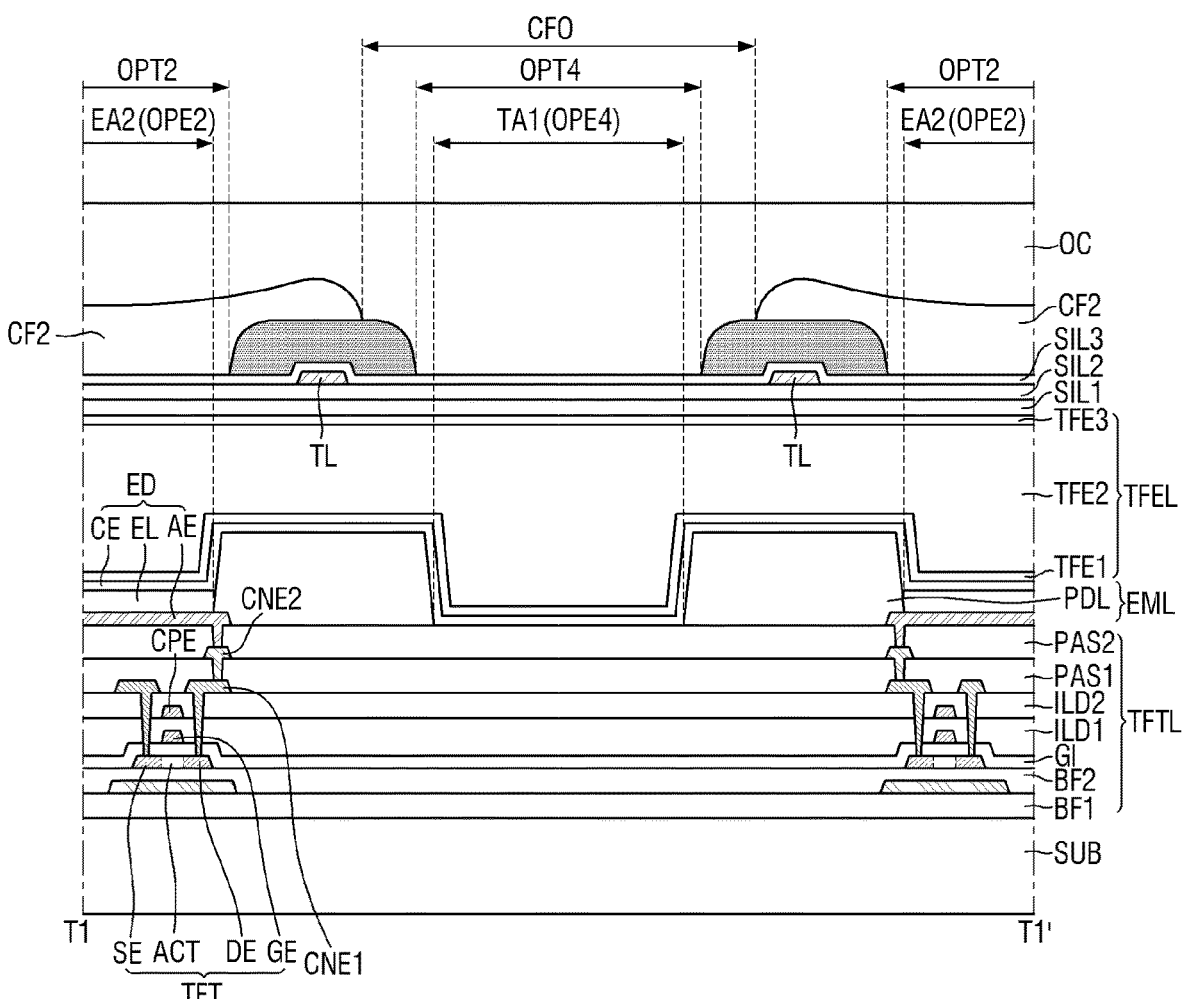
FIG. 20 is a cross-sectional view taken along line T1-T1' of FIG. 19, according to one or more embodiments of the present disclosure.
Figure 21:
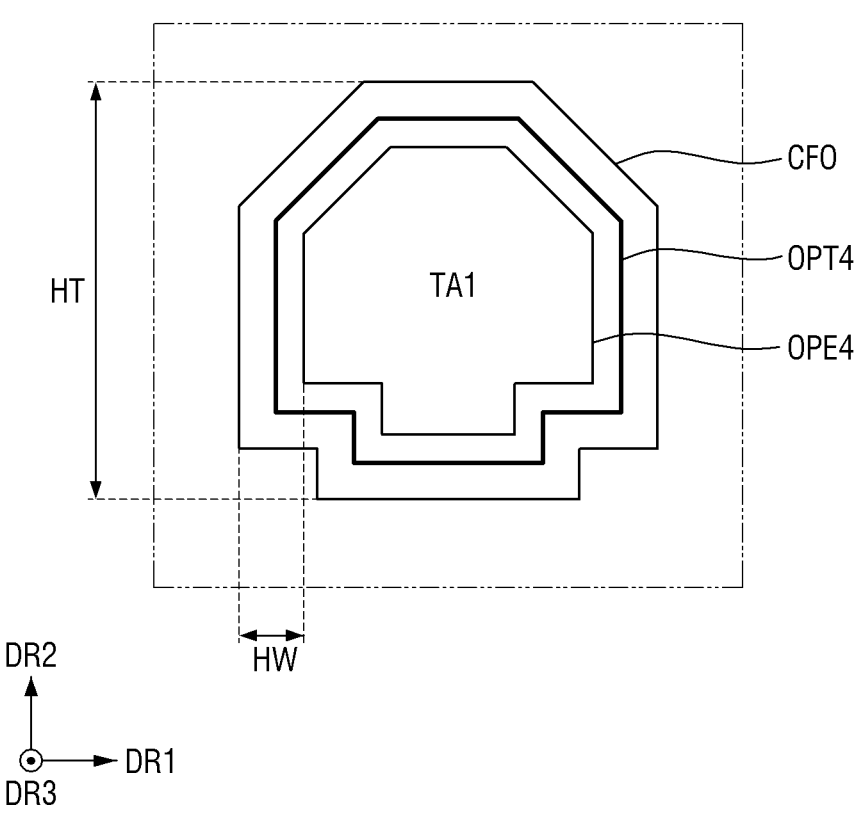
FIG. 21 is a detailed plan view of a transmission area disposed in the second display area of the display device according to one or more embodiments of the present disclosure.

FIG. 19 is a plan view illustrating, in more detail, the arrangement of the color filters CF1 through CF3 in the second display area DA2 of the display device 10 of FIG. 6, according to one or more embodiments of the present disclosure. FIG. 20 is a cross-sectional view taken along line T1-T1' of FIG. 19, according to one or more embodiments of the present disclosure. FIG. 21 is a detailed plan view of a transmission area disposed in the second display area DA2 of the display device 10 of FIG. 6, according to one or more embodiments of the present disclosure. FIG. 20 illustrates a cross-section across two second emission areas EA2 adjacent to each other in the first direction DR1 and a first transmission area TA1 disposed between them.

A cross-section of the second display area DA2 of the display device 10 will be described with reference to FIGS. 19 through 21 in addition to FIGS. 17 and 18. However, any redundant description of the same elements and features as those of the first display area DA1 will may be provided, and a first transmission area TA1 of the second display area DA2 will be described in more detail.

The pixel defining layer PDL may include a fourth opening OPE4 disposed in the second display area DA2. The fourth opening OPE4 may define the first transmission area TA1. The size or diameter of the fourth opening OPE4 may be smaller than those of the first through third openings OPE1 through OPE3, and the size or area of the first transmission area TA1 may be smaller than those of the first through third emission areas EA1 through EA3. The pixel defining layer PDL may include a light absorbing material. However, because the pixel defining layer PDL is not disposed in the first transmission area TA1, light can be smoothly incident on the optical device 500. The common electrode CE of the light emitting elements ED and the encapsulation layer TFEL may be disposed in the fourth opening OPE4 of the pixel defining layer PDL.

The touch electrode TL may be disposed not to overlap the fourth opening OPE4 of the pixel defining layer PDL. As described above, the touch electrode TL may bypass the first transmission area TA1 in a plan view and may be spaced apart (e.g., separate) from the fourth opening OPE4 in a cross-sectional view.

The light blocking layer BM may be disposed on the third touch insulating layer SIL3 of the touch sensing layer TSU and may include a fourth hole OPT4 overlapping the fourth opening OPE4. The size or area of the fourth hole OPT4 may be larger than the size or area of the fourth opening OPE4. Because the fourth hole OPT4 of the light blocking layer BM is formed to be larger than the fourth opening OPE4 of the pixel defining layer PDL, even when external light is incident on the display device 10 from the side as well as from the front, the optical device 500 can sense the light. The light blocking layer BM may include a light absorbing material. However, because the light blocking layer BM is not disposed in the first transmission area TA1, light can be smoothly incident on the optical device 500.

The color filters CF1 through CF3 of the color filter layer CFL may be disposed on the light blocking layer BM but may not cover the first transmission area TA1. The color filters CF1 through CF3 may be spaced apart (e.g., separate) from edges of the fourth hole OPT4 of the light blocking layer BM. Accordingly, the color filters CF1 through CF3 may not be disposed on a portion of the light blocking layer BM which is in contact with the fourth hole OPT4, thereby partially exposing the light blocking layer BM. A color filter opening CFO may be formed in an area which overlaps the first transmission area TA1 and in which the color filters CF1 through CF3 are not disposed. The size or area of the color filter opening CFO may be larger than the size or area of the fourth hole OPT4, and a portion of an upper surface of the light blocking layer BM may be exposed in the second display area DA2.

The first transmission area TA1 may be defined by the fourth opening OPE4, and the shape of the fourth opening OPE4 in a plan view can be variously changed. In the drawings, the fourth opening OPE4 or the first transmission area TA1 has a polygonal shape. Accordingly, the fourth hole OPT4 of the light blocking layer BM and the color filter opening CFO of the color filter layer CFL may also have a polygonal shape in a plan view. However, the disclosure is not limited thereto, and the shape of the first transmission area TA1 can also be changed to a circular shape or a quadrilateral shape, and the shape of the fourth hole OPT4 of the light blocking layer BM and the shape of the color filter opening CFO of the color filter layer CFL in a plan view can also be variously changed. In one or more embodiments, the shape of the first transmission area TA1, the shape of the fourth hole OPT4 of the light blocking layer BM, and the shape of the color filter opening CFO of the color filter layer CFL may be different from each other in a plan view. However, the size or area of the color filter opening CFO may be larger than the size or area of the fourth hole OPT4 of the light blocking layer BM, and the size or area of the fourth hole OPT4 of the light blocking layer BM may be larger than the size or area of the first transmission area TA1 so that external light can be incident on the first transmission area TA1.

In one or more embodiments, a maximum diameters (or lengths) HT of the color filter openings CFO measured in the second direction DR2 may be greater than maximum diameters (or lengths) of the fourth openings OPE4 of the pixel defining layer PDL and the fourth holes OPT4 of the light blocking layer BM measured in the second direction DR2. In one or more embodiments, maximum diameters (or lengths) of the color filter opening CFO measured in the first direction DR1 may be greater than maximum diameters (or lengths) of the fourth openings OPE4 of the pixel defining layer PDL and the fourth holes OPT4 of the light blocking layer BM measured in the second direction DR2. Edges of the color filter opening CFO (of the color filter openings CFO) may be spaced apart (e.g., separate) from edges of the first transmission area TA1 (of the first transmission areas TA1) or the fourth opening OPE4 (of the fourth openings OPE4) of the pixel defining layer PDL by a set or predetermined distance HW so that a portion of the light blocking layer BM (of the light blocking layers BM) is exposed. The distance HW between the edges of the color filter opening CFO and the edges of the fourth opening OPE4 may be smaller than a diameter (or length) of the fourth opening OPE4 measured in the first direction DR1. However, the present disclosure is not limited thereto. The shapes and sizes of the fourth hole OPT4 and the color filter opening CFO of the light blocking layer BM formed to correspond to the first transmission area TA1 can be variously and/or suitably changed.

In the display device 10 according to one or more embodiments, the planar shape of each of the color filters CF1 through CF3 may vary according to position in the display area DA. The sides of the color filters CF1 through CF3 disposed in the first display area DA1 may generally extend in the fourth direction DR4 or the fifth direction DR5 in a plan view, and edge portions where the sides meet may be angled. In contrast, the sides of the color filters CF1 through CF3 disposed in the second display area DA2 may generally extend in the fourth direction DR4 or the fifth direction DR5 in a plan view, and edge portions where the sides meet may be recessed into the color filters CF1 through CF3 to form the color filter opening CFO.

For example, in one or more embodiments in which the first transmission area TA1 is disposed in the first column C1 and the third column C3 in the second row R2 and the fourth row R4 of the color filters CF1 through CF3, in the case of the second color filters CF2 adjacent to the first transmission area TA1 in the first direction DR1, both edge portions in the first direction DR1 among the edge portions where the sides of the second color filters CF2 meet may be recessed inward along the edges of the first transmission area TA1 or the fourth hole OPT4 of the light blocking layer BM. In other words, the edge portions of adjacent second color filters CF2 in a first direction DR1 may not meet, but instead end at a recessed edge of the color filter opening CFO. In the case of the first color filter CF1 and the third color filter CF3 adjacent to the first transmission area TA1 in the second direction DR2, both edge portions in the second direction DR2 among the edge portions where the sides of the first color filter CF1 and the third color filter CF3 meet may be recessed inward along the edges of the first transmission area TA1 or the fourth hole OPT4 of the light blocking layer BM. In other words, the edge portions of adjacent first and third color filters CF1 and CF3 in a second direction DR2 may not meet, but instead end at a recessed edge of the color filter opening CFO.

The shapes of the edge portions where the sides of the color filters CF1 through CF3 meet may correspond to the shape of the color filter opening CFO, the shape of the first transmission area TA1, or the shape of the fourth hole OPT4 of the light blocking layer BM. In one or more embodiments in which the first transmission area TA1 has a polygonal shape in a plan view, the recessed edge portions of the color filters CF1 through CF3 may have an angled shape. In contrast, in one or more embodiments in which the first transmission area TA1 has a circular shape in a plan view, the recessed edge portions of the color filters CF1 through CF3 may have a curved shape.

Because the first transmission area TA1 is not disposed in the second column C2 and the fourth column C4 in the first row R1 and the third row R3 of the color filters CF1 through CF3, both edge portions the first direction DR1 among the edge portions where the sides of the second color filters CF2 adjacent to the first transmission area TA1 in the first direction DR1 meet may not be recessed inward. Both edge portions in the second direction DR2 among the edge portions where the sides of the first color filter CF1 and the third color filter CF3 adjacent to the first transmission area TA1 in the second direction DR2 meet may not be recessed inward. In a portion where the first transmission area TA1 is formed in an area where the edge portions of the color filters CF1 through CF3 meet, the color filters CF1 through CF3 may not overlap each other, thereby partially exposing the light blocking layer BM. In a portion where the first transmission area TA1 is not formed in the area where the edge portions of the color filters CF1 through CF3 meet, the color filters CF1 through CF3 may overlap each other on the light blocking layer BM.

Hereinafter, one or more embodiments of the display device 10 will be described with reference to further drawings.

Figure 22:
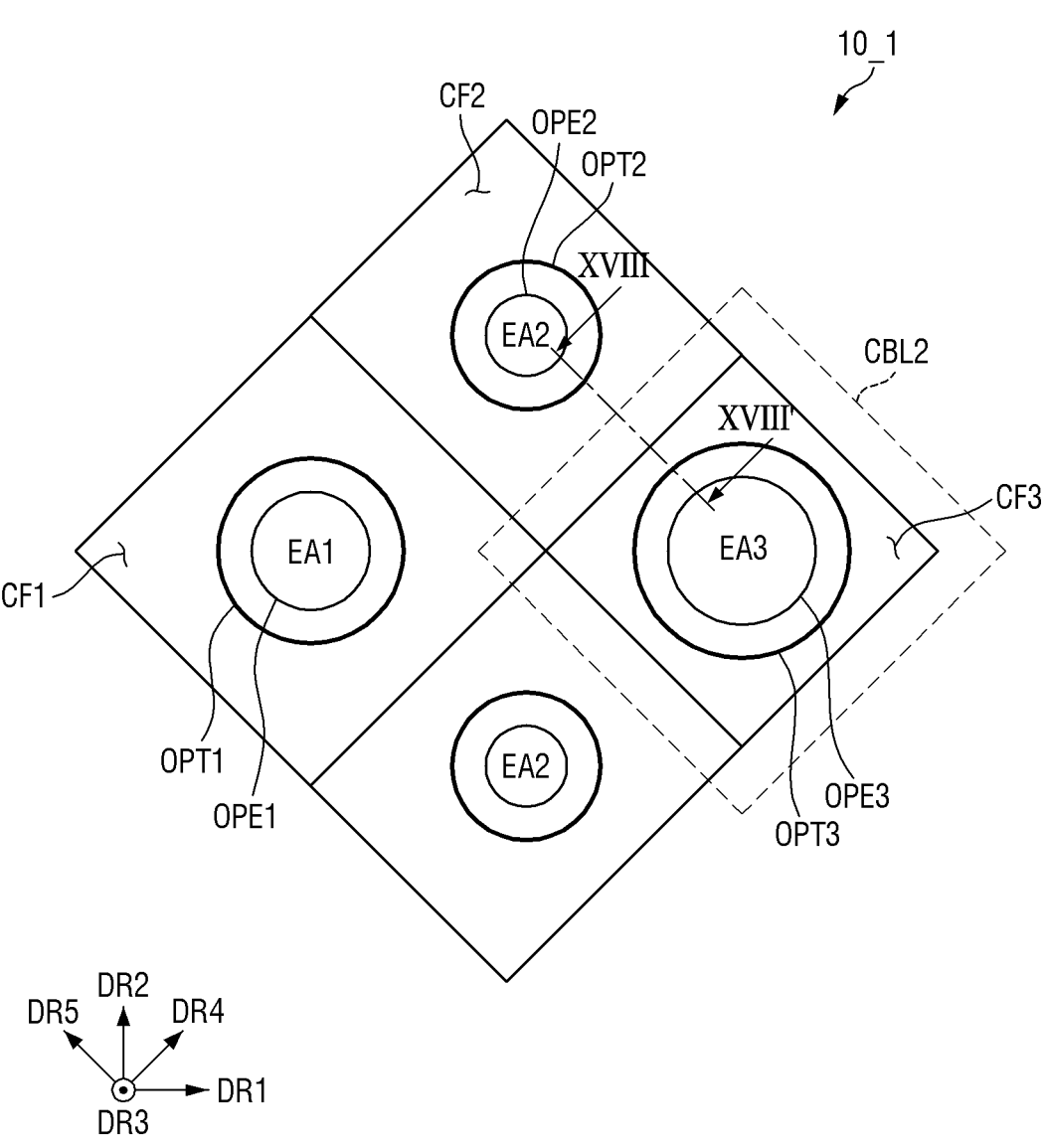
FIG. 22 is a plan view illustrating the relative arrangement of color filters of a display device according to one or more embodiments of the present disclosure.
Figure 23:
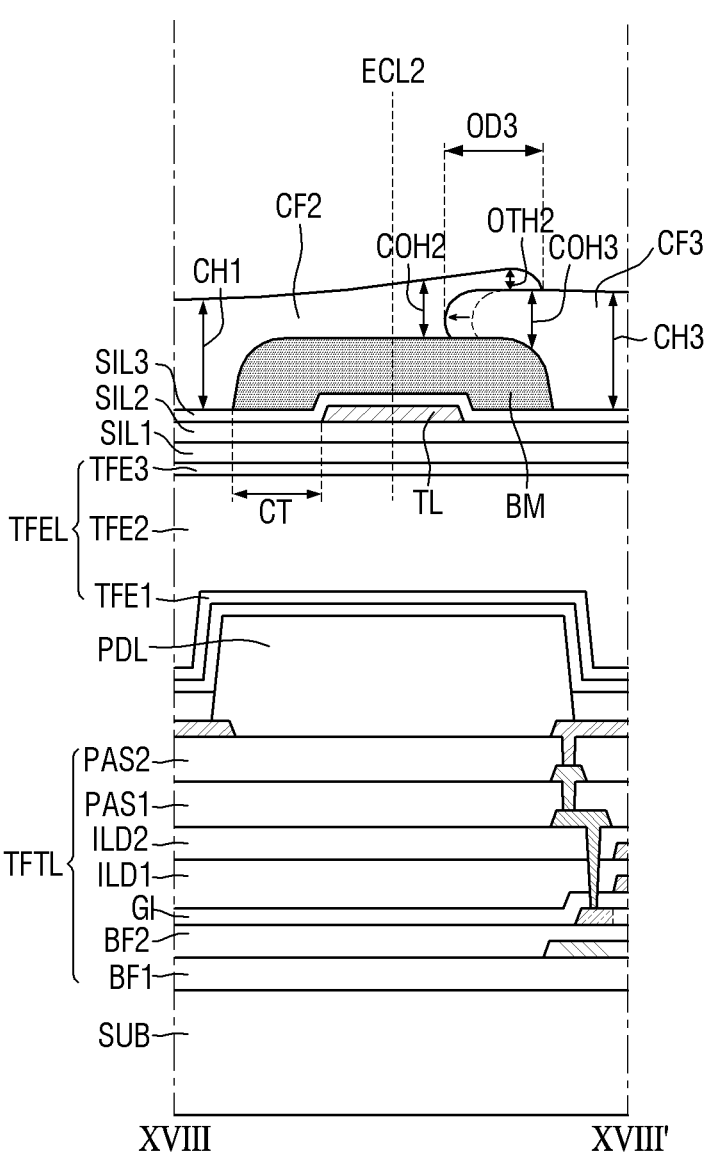
FIG. 23 is a cross-sectional view taken along line XIIIV-XIIIV' of FIG. 22, according to one or more embodiments of the present disclosure.

FIG. 22 is a plan view illustrating the relative arrangement of color filters CF1 through CF3 of a display device 10_1 according to one or more embodiments of the present disclosure. FIG. 23 is a cross-sectional view taken along line XIIIV-XIIIV' of FIG. 22, according to one or more embodiments of the present disclosure. FIG. 23 illustrates a cross-section of a portion where a second color filter CF2 and a third color filter CF3 overlap in the display device 10_1 of FIG. 22.

Referring to FIGS. 22 and 23, in the display device 10_1 according to one or more embodiments, a width OD3 of an overlapping portion of a second color filter CF2 and the third color filter CF3 may be greater than that of the embodiment(s) (a portion indicated by a dotted line in FIG. 23) of FIG. 13. In the display device 10_1, the color filters CF1 through CF3 may overlap each other on a light blocking layer BM to reduce reflection due to external light. When reflected light due to external light passes through a blue color filter, it may have a color more comfortable to a user. Therefore, the display device 10_1 may have a structure in which an area or an edge of the third color filter CF3, which is a blue color filter, is disposed adjacent to a second emission area EA2 or the second color filter CF2. Accordingly, the width OD3 of the overlapping portion of the second color filter CF2 and the third color filter CF3 may have a value of 2.5 μm or more or about 3 μm and may be in the range of 50 to 155% of a maximum width of each of the color filters CF1 through CF3. In the display device 10_1, the areas of the color filters CF1 through CF3 may be designed to reduce reflection due to external light and to have desired or suitable color coordinates of the color of the external light.

Figure 24:
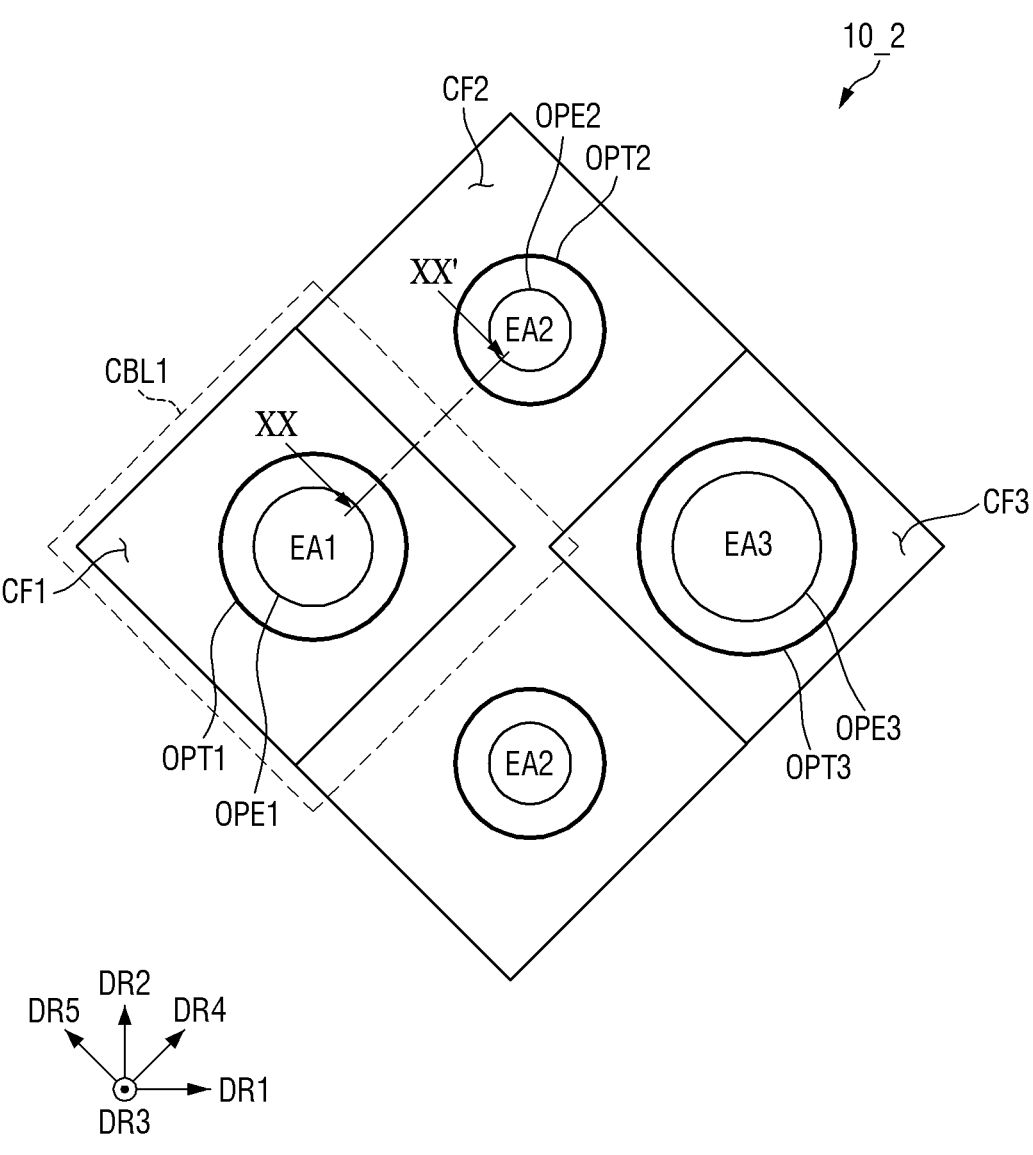
FIG. 24 is a plan view illustrating the relative arrangement of color filters of a display device according to one or more embodiments of the present disclosure.
Figure 25:
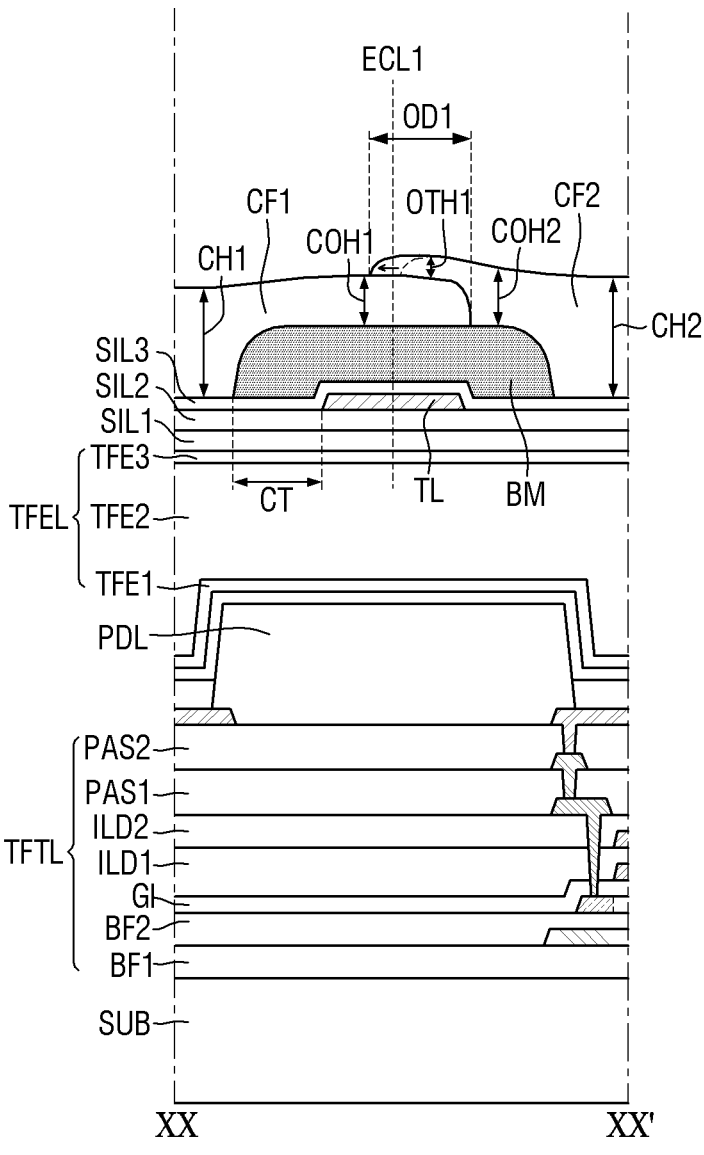
FIG. 25 is a cross-sectional view taken along line XX-XX' of FIG. 24, according to one or more embodiments of the present disclosure.

FIG. 24 is a plan view illustrating the relative arrangement of color filters CF1 through CF3 of a display device 10_2 according to one or more embodiments of the present disclosure. FIG. 25 is a cross-sectional view taken along line XX-XX' of FIG. 24, according to one or more embodiments of the present disclosure. FIG. 25 illustrates a cross section of a portion where a first color filter CF1 and a second color filter CF2 overlap in the display device 10_2 of FIG. 24.

Referring to FIGS. 24 and 25, in the display device 10_2 according to one or more embodiments, a width OD1 of an overlapping portion of a second color filter CF2 and the first color filter CF1 may be greater than that of the embodiment(s) (a portion indicated by a dotted line in FIG. 25) of FIG. 12. In the display device 10_2, the color filters CF1 through CF3 may overlap each other on a light blocking layer BM to reduce reflection due to external light. When reflected light due to external light passes through a red color filter, it may have a color uncomfortable to a user. Therefore, the display device 10_2 may have a structure in which an area or an edge of the second color filter CF2 is disposed adjacent to a first emission area EA1 or the first color filter CF1 which is a red color filter in order to reduce a portion of the first color filter CF1 which is exposed on the light blocking layer BM. Accordingly, the width OD1 of the overlapping portion of the second color filter CF2 and the first color filter CF1 may have a value of 2.5 μm or more or about 3 μm and may be in the range of 50 to 155% of a maximum width of each of the color filters CF1 through CF3. In the display device 10_2, the areas of the color filters CF1 through CF3 may be designed to reduce reflection due to external light and to have desired or suitable color coordinates of the color of the external light.

Figure 26:
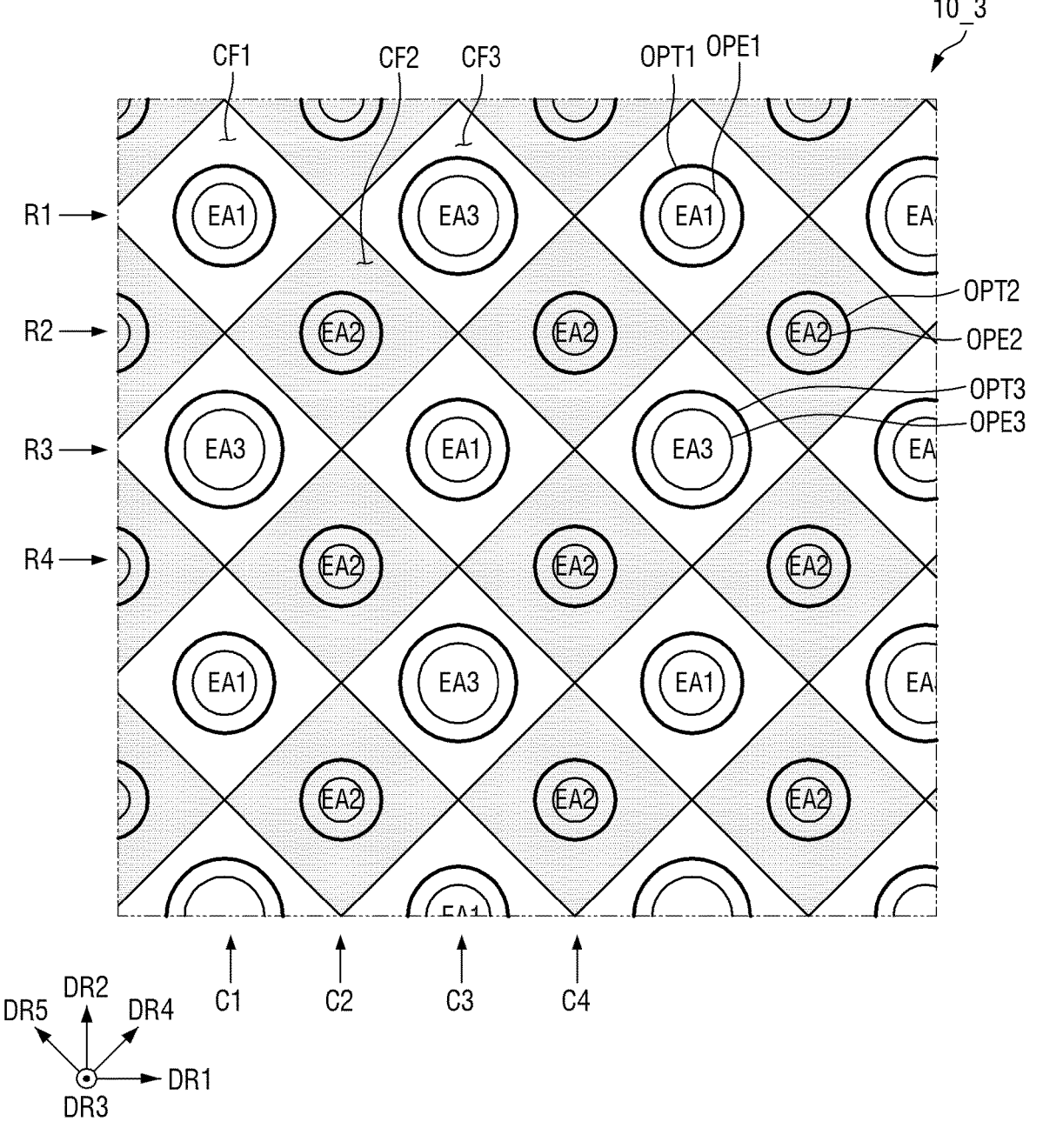
FIG. 26 is a plan view illustrating the relative arrangement of color filters of a display device according to one or more embodiments of the present disclosure.

FIG. 26 is a plan view illustrating the relative arrangement of color filters CF1 through CF3 of a display device 10_3 according to one or more embodiments of the present disclosure.

Referring to FIG. 26, in the display device 10_3 according to one or more embodiments, the color filters CF1 through CF3 may have the same area. The current embodiment(s) is(are) different from the embodiment of FIG. 9 in that the areas of the color filters CF1 through CF3 may each independently be the same. The color filters CF1 through CF3 adjacent to each other may partially overlap each other on a light blocking layer BM, and the areas of the color filters CF1 through CF3 may be designed according to the color required by the display device 10_3 or the electronic device 1 so that the intensity and color of reflected light due to external light can have desired or suitable values.

In the current embodiment(s), first color filters CF1, second color filters CF2, and third color filters CF3 may have the same area, and their sides extending in the fourth direction DR4 and the fifth direction DR5 may have the same shape. Accordingly, the first through third color filters CF1 through CF3 may have the same shape and area regardless of their position.

Figure 27:
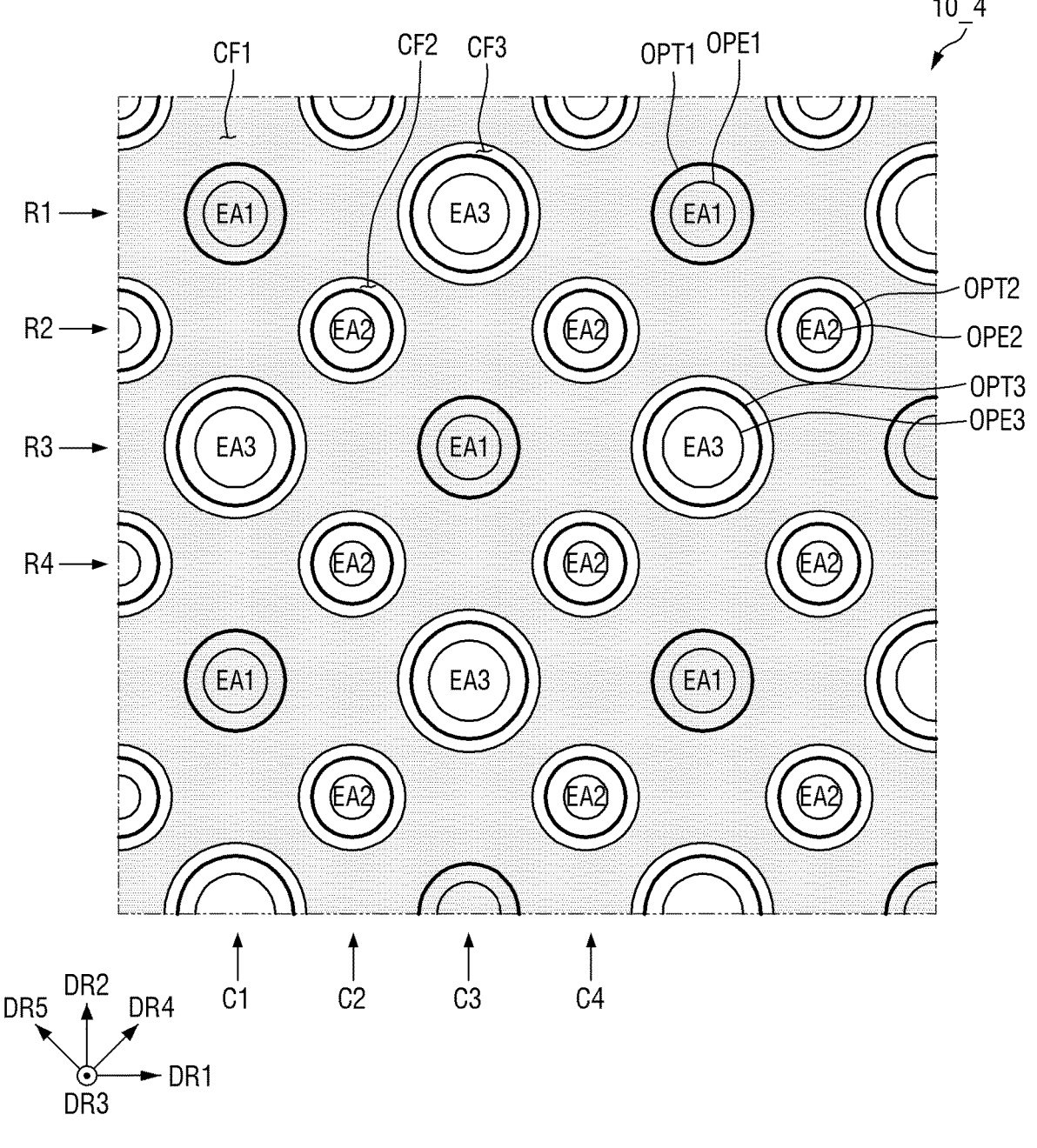
FIG. 27 is a plan view illustrating the relative arrangement of color filters of a display device according to one or more embodiments of the present disclosure.

FIG. 27 is a plan view illustrating the relative arrangement of color filters CF1 through CF3 of a display device 10_4 according to one or more embodiments of the present disclosure.

Referring to FIG. 27, in the display device 10_4 according to one or more embodiments, second color filters CF2 and third color filters CF3 may have a circular shape in a plan view, and first color filters CF1 may be disposed on the entire surfaces of a light blocking layer BM and first emission areas EA1. The current embodiment(s) is(are) different from the embodiments of FIGS. 9 and 26 in that the color filters CF1 through CF3 have different planar shapes. As in the embodiment(s) of FIG. 26, in the display device 104, the areas of the color filters CF1 through CF3 may be designed according to the color required by the display device 10_4 or the electronic device 1 so that the intensity and color of reflected light due to external light can have desired or suitable values. Other redundant descriptions may not be provided.

A display device according to one or more embodiments may be designed such that color filters disposed on light emitting elements partially overlap each other and that the color filters of different colors overlap in an order that can reduce reflection of external light. In one or more embodiments, the display device may be designed such that color filters in an area where light is not emitted overlap each other in an order that can lower reflectance. Accordingly, it is possible to reduce reflection of external light while maintaining the efficiency and life of the light emitting elements.

As used herein, the singular forms "a," "an" and "the" are intended to include the plural forms as well, unless the context clearly indicates otherwise. It will be further understood that the terms "comprises," "comprising," "includes," and "including," when used in this disclosure, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Expressions such as "at least one of," "a plurality of," "one of," and other prepositional phrases, when preceding a list of elements, should be understood as including the disjunctive if written as a conjunctive list and vice versa. For example, the expressions "at least one of a, b, or c," "at least one of a, b, and/or c," "one selected from the group consisting of a, b, and c," "at least one selected from a, b, and c," "at least one from among a, b, and c," "one from among a, b, and c", "at least one of a to c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent deviations in measured or calculated values that would be recognized by those of ordinary skill in the art. "Substantially" as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "substantially" may mean within one or more standard deviations, or within ±30%, 20%, 10%, 5% of the stated value.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Further, the use of "may" when describing embodiments of the present disclosure refers to "one or more embodiments of the present disclosure."

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

The light emitting device, electronic apparatus or any other relevant devices or components according to embodiments of the present disclosure described herein may be implemented utilizing any suitable hardware, firmware (e.g., an application-specific integrated circuit), software, or a combination of software, firmware, and hardware. For example, the various components of the device may be formed on one integrated circuit (IC) chip or on separate IC chips. Further, the various components of the device may be implemented on a flexible printed circuit film, a tape carrier package (TCP), a printed circuit board (PCB), or formed on one substrate. Further, the various components of the device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random-access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the embodiments of the present disclosure Although embodiments of the present disclosure have been described, it is understood that the present disclosure should not be limited to these embodiments, but one or more suitable changes and modifications can be made by one ordinary skilled in the art within the spirit and scope of the present disclosure as defined by the following claims and equivalents thereof.

What is claimed is:

1. A display device comprising:
   a plurality of emission areas arranged in a first direction, a second direction intersecting the first direction, and a third direction intersecting the first direction and the second direction, and in which light emitting elements, to emit light, are located;
   a light blocking layer comprising a plurality of holes overlapping the plurality of emission areas and between adjacent emission areas of the plurality of emission areas; and
   a plurality of color filters in the plurality of holes of the light blocking layer and overlapping the plurality of emission areas,
   wherein the plurality of emission areas comprises:
      a first emission area,
      a second emission area spaced apart from the first emission area in a plan view normal to the third direction, and
      a third emission area spaced apart from the second emission area in the plan view normal to the third direction, and
   wherein the plurality of color filters comprises:
      a first color filter overlapping the first emission area,
      a second color filter overlapping the second emission area, and
      a third color filter overlapping the third emission area, wherein a portion of the second color filter is on the first color filter adjacent to the second color filter in the plan view normal to the third direction on the light blocking layer and on the third color filter adjacent to the second color filter in the plan view normal to the third direction on the light blocking layer, and wherein, in the plan view normal to the third direction, a center of an overlapping portion of the second color filter and the first color filter, or a center of an overlapping portion of the second color filter and the third color filter, is closer to an adjacent emission area of the plurality of emission areas than a center of the light blocking layer on which is the overlapping portion is located is to the adjacent emission area.

2. The display device of claim 1, wherein planar areas of the first color filter, the second color filter and the third color filter combined are larger than planar areas of the plurality of holes of the light blocking layer.

3. The display device of claim 2, wherein the planar areas of the plurality of holes of the light blocking layer are larger than planar areas of the plurality of emission areas.

4. The display device of claim 1, wherein the plurality of color filters covers the light blocking layer.

5. The display device of claim 4, wherein a portion of each of the first color filter, the second color filter, and the third color filter is on the light blocking layer.

6. The display device of claim 1, wherein the first emission area and the third emission area are spaced apart from each other in the first direction or the second direction, and a portion of the third color filter is on an adjacent first color filter on the light blocking layer.

7. The display device of claim 6, wherein the overlapping portion of the first color filter and the second color filter is adjacent to the second emission area relative to a center of a portion of the light blocking layer between the first emission area and the second emission area.

8. The display device of claim 6, wherein the overlapping portion of the second color filter and the third color filter is adjacent to the third emission area relative to a center of a portion of the light blocking layer between the second emission area and the third emission area.

9. The display device of claim 1, comprising a plurality of touch electrodes overlapping the light blocking layer and spaced apart from the plurality of emission areas.

10. The display device of claim 9, wherein an overlapping portion of the first color filter and the second color filter is adjacent to the second emission area relative to a center of a touch electrode between the first emission area and the second emission area.

11. The display device of claim 9, wherein an overlapping portion of the second color filter and the third color filter is adjacent to the third emission area relative to a center of a touch electrode between the second emission area and the third emission area.

12. The display device of claim 1, further comprising a first transmission area between the first emission area and the third emission area adjacent to each other in the second direction, wherein the light blocking layer comprises a fourth hole overlapping the first transmission area.

13. The display device of claim 12, wherein a size of the fourth hole of the light blocking layer in the plan view normal to the third direction is larger than a size of the first transmission area in the plan view normal to the third direction.

14. The display device of claim 12, wherein each of the first color filter and the third color filter does not overlap the first transmission area and the fourth hole, and a portion of the light blocking layer at edges of the fourth hole is not covered by the color filters.

15. The display device of claim 14, wherein respective edge portions of the first color filter and the third color filter in the second direction are partially recessed inwardly along the edges of the fourth hole.

16. The display device of claim 12, wherein the plurality of color filters further comprises a plurality of second color filters spaced apart from each other in the first direction with the first transmission area therebetween, wherein the second color filters do not overlap the fourth hole of the light blocking layer.

17. The display device of claim 16, wherein respective edge portions of the second color filters in the first direction are partially recessed inwardly along edges of the fourth hole.

18. A display device comprising:

a plurality of emission areas arranged in a first direction, a second direction intersecting the first direction, and a third direction intersecting the first direction and the second direction, and in which light emitting elements, to emit light, are located;

a light blocking layer comprising a plurality of holes overlapping the plurality of emission areas and between adjacent emission areas of the plurality of emission areas; and a plurality of color filters in the plurality of holes of the light blocking layer and overlapping the plurality of emission areas, wherein the plurality of emission areas comprises:

a first emission area, a second emission area spaced apart from the first emission area in a plan view normal to the third direction, and a third emission area spaced apart from the second emission area in the plan view normal to the third direction, wherein the plurality of color filters comprises:

a first color filter overlapping the first emission area, a second color filter overlapping the second emission area, and a third color filter overlapping the third emission area, wherein a portion of the second color filter is on the first color filter adjacent to the second color filter in the plan view normal to the third direction on the light blocking layer and on the third color filter adjacent to the second color filter in the plan view normal to the third direction on the light blocking layer, and wherein a planar area of the first color filter is equal to or larger than a planar area of the second color filter and equal to or larger than a planar area of the third color filter.

19. The display device of claim 18, wherein the planar area of the first color filter is larger than the planar area of the third color filter, and the second color filter extends in a direction normal to the third direction.

20. The display device of claim 18, wherein the planar area of the first color filter and planar area of the second color filter have a ratio of 1:0.4 to 1:0.6, and the planar area of the first color filter and the planar area of the third color filter have a ratio of 1:0.4 to 1:1.

21. The display device of claim 18, wherein the second color filter and the third color filter have a circular shape in the plan view normal to the third direction, and the first color filter overlaps the light blocking layer.

22. A display device comprising:

a display layer comprising a plurality of light emitting elements in a plurality of emission areas to emit light;

a light blocking layer on the display layer and comprising a plurality of holes overlapping the plurality of emission areas; and a plurality of color filters in the plurality of holes and on the light blocking layer and overlapping the plurality of emission areas, wherein the plurality of color filters comprises:

a first color filter comprising a red color filter overlapping a first emission area, a second color filter comprising a green color filter overlapping a second emission area, and a third color filter comprising a blue color filter overlapping a third emission area, wherein a portion of the second color filter is on an adjacent first color filter and a portion of the second color filter is on an adjacent third color filter on the light blocking layer, and a width of an overlapping portion of the second color filter and the first color filter or the third color filter is in a range of 37.5% to 125% of a maximum thickness of the second color filter.

23. The display device of claim 22, wherein the plurality of holes of the light blocking layer has a larger area than the plurality of emission areas, and the first color filter, the second color filter and the third color filter combined have a larger area than the plurality of holes.

24. The display device of claim 23, wherein a thickness of the portion of the second color filter on the adjacent first color filter or the portion of the second color filter on the adjacent third color filter is in a range of 12.5% to 75% of the maximum thickness of the second color filter.

25. The display device of claim 23, wherein a portion of the third color filter is on the adjacent first color filter on the light blocking layer.

26. The display device of claim 22, further comprising a touch electrode between the display layer and the light blocking layer and overlapping the light blocking layer, wherein the overlapping portion of the second color filter and the first color filter or the third color filter is located to one side of a center of the touch electrode.

27. The display device of claim 22, wherein the first color filter is the adjacent first color filter and the third color filter is the adjacent third color filter.

* * * * *